United States Patent
Amdahl

(10) Patent No.: US 10,033,837 B1
(45) Date of Patent: Jul. 24, 2018

(54) SYSTEM AND METHOD FOR UTILIZING A DATA REDUCING MODULE FOR DICTIONARY COMPRESSION OF ENCODED DATA

(71) Applicant: F5 Networks, Inc., Seattle, WA (US)

(72) Inventor: Saxon Amdahl, Mountain View, CA (US)

(73) Assignee: F5 Networks, Inc., Seattle, WA (US)

( * ) Notice: Subject to any disclaimer, the term of this patent is extended or adjusted under 35 U.S.C. 154(b) by 923 days.

(21) Appl. No.: 14/042,237

(22) Filed: Sep. 30, 2013

Related U.S. Application Data

(60) Provisional application No. 61/707,890, filed on Sep. 29, 2012.

(51) Int. Cl.
*G06F 15/16* (2006.01)
*H04L 29/06* (2006.01)

(52) U.S. Cl.
CPC .................. *H04L 69/04* (2013.01)

(58) Field of Classification Search
CPC ...................................... H04L 69/04
USPC ........ 709/201, 202, 203, 217.229, 217, 229; 726/1, 29
See application file for complete search history.

(56) References Cited

U.S. PATENT DOCUMENTS

| | | |
|---|---|---|
| 5,282,201 A | 1/1994 | Frank et al. |
| 5,388,237 A | 2/1995 | Sodos |
| 5,550,816 A | 8/1996 | Hardwick et al. |
| 5,606,665 A | 2/1997 | Yang et al. |
| 5,623,490 A | 4/1997 | Richter et al. |
| 5,761,534 A | 6/1998 | Lundberg et al. |
| 5,828,835 A | 10/1998 | Isfeld et al. |
| 5,941,988 A | 8/1999 | Bhagwat et al. |
| 5,991,302 A | 11/1999 | Berl et al. |

(Continued)

FOREIGN PATENT DOCUMENTS

| | | |
|---|---|---|
| CA | 2080530 | 4/1994 |
| CA | 2080530 A1 | 4/1994 |

(Continued)

OTHER PUBLICATIONS

Blue Coat, "Technology Primer: CIFS Protocol Optimization," Blue Coat Systems Inc., 2007, last accessed: Dec. 9, 2013, pp. 1-3, (http://www.bluecoat.com).

(Continued)

*Primary Examiner* — Davoud Zand
(74) *Attorney, Agent, or Firm* — LeClairRyan PLLC

(57) ABSTRACT

A system, medium and method of performing dictionary compression is disclosed. A first data segment received at a receiver device (RD) from a transmiter device (TD) is selected A global bloom filter of the TD is queried to determine if the RD has a stored copy of a first plurality of content data bytes and corresponding first identifier and data length information for the first data segment. A first encoded data packet is prepared and sent which includes the first identifier and data length information without the first plurality of content data bytes. The RD utilizes the received first identifier and data length information to retrieve the first plurality of content data bytes associated with the first data segment from the RD's data store and decodes the first data segment to include the first plurality of content data bytes.

20 Claims, 7 Drawing Sheets

(56) References Cited

U.S. PATENT DOCUMENTS

| | | |
|---|---|---|
| 5,995,491 A | 11/1999 | Richter et al. |
| 6,026,443 A | 2/2000 | Oskouy et al. |
| 6,026,500 A | 2/2000 | Topff et al. |
| 6,029,175 A | 2/2000 | Chow et al. |
| 6,041,365 A | 3/2000 | Kleinerman |
| 6,047,356 A | 4/2000 | Anderson et al. |
| 6,067,558 A | 5/2000 | Wendt et al. |
| 6,104,706 A | 8/2000 | Richter et al. |
| 6,115,802 A | 9/2000 | Tock et al. |
| 6,154,777 A | 11/2000 | Ebrahim |
| 6,157,950 A | 12/2000 | Krishnan |
| 6,253,326 B1 * | 6/2001 | Lincke ............... G06F 17/3089 380/255 |
| 6,259,405 B1 | 7/2001 | Stewart et al. |
| 6,260,070 B1 | 7/2001 | Shah |
| 6,292,832 B1 | 9/2001 | Shah et al. |
| 6,304,913 B1 | 10/2001 | Rune |
| 6,330,574 B1 | 12/2001 | Murashita |
| 6,338,082 B1 | 1/2002 | Schneider |
| 6,353,848 B1 | 3/2002 | Morris |
| 6,363,056 B1 | 3/2002 | Beigi et al. |
| 6,370,527 B1 | 4/2002 | Singhal |
| 6,389,462 B1 | 5/2002 | Cohen et al. |
| 6,397,259 B1 * | 5/2002 | Lincke ............... G06F 17/3089 707/E17.116 |
| 6,446,108 B1 | 9/2002 | Rosenberg et al. |
| 6,466,580 B1 | 10/2002 | Leung |
| 6,469,983 B2 | 10/2002 | Narayana et al. |
| 6,513,061 B1 | 1/2003 | Ebata et al. |
| 6,514,085 B2 | 2/2003 | Slattery et al. |
| 6,529,508 B1 | 3/2003 | Li et al. |
| 6,542,936 B1 | 4/2003 | Mayle et al. |
| 6,560,230 B1 | 5/2003 | Li et al. |
| 6,578,069 B1 | 6/2003 | Hopmann et al. |
| 6,615,267 B1 | 9/2003 | Whalen et al. |
| 6,631,422 B1 | 10/2003 | Althaus et al. |
| 6,654,346 B1 | 11/2003 | Mahalingaiah et al. |
| 6,700,871 B1 | 3/2004 | Harper et al. |
| 6,701,415 B1 | 3/2004 | Hendren, III |
| 6,708,220 B1 | 3/2004 | Olin |
| 6,728,704 B2 | 4/2004 | Mao et al. |
| 6,738,357 B1 | 5/2004 | Richter et al. |
| 6,744,776 B1 | 6/2004 | Kalkunte et al. |
| 6,748,457 B2 | 6/2004 | Fallon et al. |
| 6,754,215 B1 | 6/2004 | Arikawa et al. |
| 6,754,699 B2 | 6/2004 | Swildens et al. |
| 6,760,337 B1 | 7/2004 | Snyder, II et al. |
| 6,781,990 B1 | 8/2004 | Puri et al. |
| 6,795,860 B1 | 9/2004 | Shah |
| 6,820,133 B1 | 11/2004 | Grove et al. |
| 6,857,009 B1 | 2/2005 | Ferreria |
| 6,862,282 B1 | 3/2005 | Oden |
| 6,865,593 B1 | 3/2005 | Reshef et al. |
| 6,868,447 B1 | 3/2005 | Slaughter et al. |
| 6,871,221 B1 | 3/2005 | Styles |
| 6,880,017 B1 | 4/2005 | Marce et al. |
| 6,883,137 B1 | 4/2005 | Girardot et al. |
| 6,904,040 B2 | 6/2005 | Salapura et al. |
| 6,914,881 B1 | 7/2005 | Mansfield et al. |
| 6,928,518 B2 | 8/2005 | Talagala |
| 6,970,475 B1 | 11/2005 | Fraser et al. |
| 6,970,924 B1 | 11/2005 | Chu et al. |
| 6,973,490 B1 | 12/2005 | Robertson et al. |
| 6,975,592 B1 | 12/2005 | Seddigh et al. |
| 6,990,074 B2 | 1/2006 | Wan et al. |
| 6,990,114 B1 | 1/2006 | Erimli et al. |
| 7,003,564 B2 | 2/2006 | Greuel et al. |
| 7,006,502 B2 | 2/2006 | Lin |
| 7,020,713 B1 | 3/2006 | Shah et al. |
| 7,023,974 B1 | 4/2006 | Brannam et al. |
| 7,031,971 B1 | 4/2006 | Piper et al. |
| 7,035,212 B1 | 4/2006 | Mittal et al. |
| 7,039,061 B2 | 5/2006 | Connor et al. |
| 7,065,482 B2 | 6/2006 | Shorey et al. |
| 7,065,630 B1 | 6/2006 | Ledebohm et al. |
| 7,075,924 B2 | 7/2006 | Richter et al. |
| 7,076,689 B2 | 7/2006 | Atkinson |
| 7,080,314 B1 | 7/2006 | Garofalakis et al. |
| 7,089,491 B2 | 8/2006 | Feinberg et al. |
| 7,107,348 B2 | 9/2006 | Shimada et al. |
| 7,113,996 B2 | 9/2006 | Kronenberg |
| 7,133,863 B2 | 11/2006 | Teng et al. |
| 7,142,540 B2 | 11/2006 | Bendel et al. |
| 7,161,904 B2 | 1/2007 | Hussain et al. |
| 7,191,163 B2 | 3/2007 | Herrera et al. |
| 7,228,359 B1 | 6/2007 | Monteiro |
| 7,236,491 B2 | 6/2007 | Tsao et al. |
| 7,240,100 B1 | 7/2007 | Wein et al. |
| 7,257,633 B2 | 8/2007 | Masputra et al. |
| 7,281,030 B1 | 10/2007 | Davis |
| 7,292,541 B1 | 11/2007 | Cs |
| 7,296,263 B1 | 11/2007 | Jacob |
| 7,299,218 B2 | 11/2007 | Bellamkonda et al. |
| 7,308,475 B1 | 12/2007 | Pruitt et al. |
| 7,324,525 B2 | 1/2008 | Fuhs et al. |
| 7,324,533 B1 | 1/2008 | DeLiberato et al. |
| 7,340,571 B2 | 3/2008 | Saze |
| 7,355,977 B1 | 4/2008 | Li |
| 7,373,438 B1 | 5/2008 | DeBergalis et al. |
| 7,376,772 B2 | 5/2008 | Fallon |
| 7,403,542 B1 | 7/2008 | Thompson |
| 7,409,440 B1 | 8/2008 | Jacob |
| 7,420,931 B2 | 9/2008 | Nanda et al. |
| 7,469,241 B2 | 12/2008 | Bellamkonda et al. |
| 7,478,186 B1 | 1/2009 | Onufryk et al. |
| 7,496,695 B2 | 2/2009 | Go et al. |
| 7,500,028 B2 | 3/2009 | Yamagishi |
| 7,512,721 B1 | 3/2009 | Olson |
| 7,533,197 B2 | 5/2009 | Leonard et al. |
| 7,555,608 B2 | 6/2009 | Naik et al. |
| 7,558,910 B2 | 7/2009 | Alverson |
| 7,571,299 B2 | 8/2009 | Loeb |
| 7,577,723 B2 | 8/2009 | Matsuda et al. |
| 7,640,347 B1 | 12/2009 | Sloat et al. |
| 7,647,416 B2 | 1/2010 | Chiang et al. |
| 7,657,659 B1 | 2/2010 | Lambeth et al. |
| 7,668,727 B2 | 2/2010 | Mitchell et al. |
| 7,668,851 B2 | 2/2010 | Triplett |
| 7,684,423 B2 | 3/2010 | Tripathi et al. |
| 7,688,727 B1 | 3/2010 | Ferguson et al. |
| 7,698,458 B1 | 4/2010 | Liu et al. |
| 7,729,239 B1 | 6/2010 | Aronov et al. |
| 7,734,809 B2 | 6/2010 | Joshi et al. |
| 7,735,099 B1 | 6/2010 | Micalizzi, Jr. |
| 7,742,412 B1 | 6/2010 | Medina |
| 7,784,093 B2 | 8/2010 | Deng et al. |
| 7,822,839 B1 | 10/2010 | Pruitt et al. |
| 7,826,487 B1 | 11/2010 | Mukerji et al. |
| 7,861,085 B1 | 12/2010 | Case et al. |
| 7,877,524 B1 | 1/2011 | Annem et al. |
| 7,895,653 B2 | 2/2011 | Calo et al. |
| 7,903,554 B1 | 3/2011 | Manur et al. |
| 7,908,245 B2 | 3/2011 | Nakano et al. |
| 7,916,728 B1 | 3/2011 | Mimms |
| 7,958,222 B1 | 6/2011 | Pruitt et al. |
| 7,984,500 B1 | 7/2011 | Khanna et al. |
| 8,006,016 B2 | 8/2011 | Muller et al. |
| 8,024,443 B1 | 9/2011 | Jacob |
| 8,037,528 B2 | 10/2011 | Williams et al. |
| 8,064,342 B2 | 11/2011 | Badger |
| 8,069,225 B2 | 11/2011 | McCanne et al. |
| 8,103,809 B1 | 1/2012 | Michels et al. |
| 8,112,491 B1 | 2/2012 | Michels et al. |
| 8,112,594 B2 | 2/2012 | Giacomoni et al. |
| 8,155,128 B2 | 4/2012 | Balyan et al. |
| 8,171,124 B2 | 5/2012 | Kondamuru |
| 8,190,769 B1 | 5/2012 | Shukla et al. |
| 8,271,620 B2 | 9/2012 | Witchey |
| 8,279,865 B2 | 10/2012 | Giacomoni et al. |
| 8,396,836 B1 | 3/2013 | Ferguson et al. |
| 8,484,348 B2 | 3/2013 | Subramanian et al. |
| 8,463,850 B1 | 6/2013 | McCann |
| 8,601,000 B1 | 12/2013 | Stefani et al. |

(56) References Cited

U.S. PATENT DOCUMENTS

| | | | |
|---|---|---|---|
| 8,656,253 B2* | 2/2014 | Leggette | G06F 21/6218 |
| | | | 382/173 |
| 8,838,817 B1 | 9/2014 | Biswas | |
| 8,879,431 B2 | 11/2014 | Ridel et al. | |
| 8,959,215 B2 | 2/2015 | Koponen et al. | |
| 9,143,451 B2 | 9/2015 | Amdahl et al. | |
| 9,244,843 B1 | 1/2016 | Michels et al. | |
| 9,497,614 B1 | 11/2016 | Ridel et al. | |
| 2001/0007560 A1 | 7/2001 | Masuda et al. | |
| 2001/0032254 A1* | 10/2001 | Hawkins | G06F 17/3089 |
| | | | 709/219 |
| 2002/0010757 A1 | 1/2002 | Granik et al. | |
| 2002/0012352 A1 | 1/2002 | Hansson et al. | |
| 2002/0038360 A1 | 3/2002 | Andrews et al. | |
| 2002/0065848 A1 | 5/2002 | Walker et al. | |
| 2002/0072048 A1 | 6/2002 | Slattery et al. | |
| 2002/0075815 A1* | 6/2002 | Sharma | H04L 12/6418 |
| | | | 370/276 |
| 2002/0087571 A1 | 7/2002 | Stapel et al. | |
| 2002/0087744 A1 | 7/2002 | Kitchin | |
| 2002/0099829 A1 | 7/2002 | Richards et al. | |
| 2002/0099842 A1 | 7/2002 | Jennings et al. | |
| 2002/0103823 A1 | 8/2002 | Jackson et al. | |
| 2002/0143819 A1 | 10/2002 | Han et al. | |
| 2002/0143852 A1 | 10/2002 | Guo et al. | |
| 2002/0162118 A1 | 10/2002 | Levy et al. | |
| 2002/0174216 A1 | 11/2002 | Shorey et al. | |
| 2002/0194112 A1 | 12/2002 | DePinto et al. | |
| 2002/0194342 A1 | 12/2002 | Lu et al. | |
| 2002/0198956 A1 | 12/2002 | Dunshea et al. | |
| 2003/0005172 A1 | 1/2003 | Chessell | |
| 2003/0009528 A1 | 1/2003 | Sharif et al. | |
| 2003/0018450 A1 | 1/2003 | Carley | |
| 2003/0018585 A1 | 1/2003 | Butler et al. | |
| 2003/0034905 A1 | 2/2003 | Anton et al. | |
| 2003/0051045 A1 | 3/2003 | Connor | |
| 2003/0055723 A1 | 3/2003 | English | |
| 2003/0067930 A1 | 4/2003 | Salapura et al. | |
| 2003/0074301 A1 | 4/2003 | Solomon | |
| 2003/0105846 A1 | 6/2003 | Zhao et al. | |
| 2003/0108000 A1 | 6/2003 | Chaney et al. | |
| 2003/0108002 A1 | 6/2003 | Chaney et al. | |
| 2003/0128708 A1 | 7/2003 | Inoue et al. | |
| 2003/0130945 A1 | 7/2003 | Force | |
| 2003/0139934 A1 | 7/2003 | Mandera | |
| 2003/0156586 A1 | 8/2003 | Lee et al. | |
| 2003/0179755 A1 | 9/2003 | Fraser | |
| 2003/0189936 A1 | 10/2003 | Terrell et al. | |
| 2003/0191812 A1 | 10/2003 | Agarwalla et al. | |
| 2003/0195813 A1 | 10/2003 | Pallister et al. | |
| 2003/0204636 A1 | 10/2003 | Greenblat et al. | |
| 2003/0212954 A1 | 11/2003 | Patrudu | |
| 2003/0220835 A1 | 11/2003 | Barnes, Jr. | |
| 2003/0229665 A1 | 12/2003 | Ryman | |
| 2003/0236995 A1 | 12/2003 | Fretwell, Jr. | |
| 2004/0006591 A1 | 1/2004 | Matsui et al. | |
| 2004/0015783 A1 | 1/2004 | Lennon et al. | |
| 2004/0017825 A1 | 1/2004 | Stanwood et al. | |
| 2004/0030627 A1 | 2/2004 | Sedukhin | |
| 2004/0030740 A1 | 2/2004 | Stelting | |
| 2004/0043758 A1 | 3/2004 | Sorvari et al. | |
| 2004/0059789 A1 | 3/2004 | Shum | |
| 2004/0064544 A1 | 4/2004 | Barsness et al. | |
| 2004/0064554 A1 | 4/2004 | Kuno et al. | |
| 2004/0093361 A1 | 5/2004 | Therrien et al. | |
| 2004/0122926 A1 | 6/2004 | Moore et al. | |
| 2004/0123277 A1 | 6/2004 | Schrader et al. | |
| 2004/0133605 A1 | 7/2004 | Chang et al. | |
| 2004/0138858 A1 | 7/2004 | Carley | |
| 2004/0167967 A1 | 8/2004 | Bastian et al. | |
| 2004/0177165 A1 | 9/2004 | Masputra et al. | |
| 2004/0202161 A1 | 10/2004 | Stachura et al. | |
| 2004/0213156 A1 | 10/2004 | Smallwood et al. | |
| 2004/0215665 A1 | 10/2004 | Edgar et al. | |
| 2004/0236826 A1 | 11/2004 | Harville et al. | |
| 2004/0249948 A1 | 12/2004 | Sethi et al. | |
| 2004/0267897 A1 | 12/2004 | Hill et al. | |
| 2005/0007991 A1 | 1/2005 | Ton et al. | |
| 2005/0008017 A1 | 1/2005 | Datta et al. | |
| 2005/0021703 A1 | 1/2005 | Cherry et al. | |
| 2005/0027841 A1 | 2/2005 | Rolfe | |
| 2005/0044158 A1 | 2/2005 | Malik | |
| 2005/0083952 A1 | 4/2005 | Swain | |
| 2005/0114559 A1 | 5/2005 | Miller | |
| 2005/0117589 A1 | 6/2005 | Douady et al. | |
| 2005/0165656 A1 | 7/2005 | Frederick et al. | |
| 2005/0174944 A1 | 8/2005 | Legault et al. | |
| 2005/0175013 A1 | 8/2005 | Le Pennec et al. | |
| 2005/0175014 A1 | 8/2005 | Patrick | |
| 2005/0198234 A1 | 9/2005 | Leib et al. | |
| 2005/0213570 A1 | 9/2005 | Stacy et al. | |
| 2005/0213587 A1 | 9/2005 | Cho et al. | |
| 2005/0234928 A1 | 10/2005 | Shkvarchuk et al. | |
| 2005/0240664 A1 | 10/2005 | Chen et al. | |
| 2005/0256806 A1 | 11/2005 | Tien et al. | |
| 2005/0273456 A1 | 12/2005 | Revanuru et al. | |
| 2006/0007928 A1 | 1/2006 | Sangillo | |
| 2006/0031374 A1 | 2/2006 | Lu et al. | |
| 2006/0031778 A1 | 2/2006 | Goodwin et al. | |
| 2006/0045089 A1 | 3/2006 | Bacher et al. | |
| 2006/0045096 A1 | 3/2006 | Farmer et al. | |
| 2006/0047785 A1 | 3/2006 | Wang et al. | |
| 2006/0100752 A1 | 5/2006 | Kim et al. | |
| 2006/0104303 A1 | 5/2006 | Makineni et al. | |
| 2006/0112367 A1 | 5/2006 | Harris | |
| 2006/0116989 A1 | 6/2006 | Bellamkonda et al. | |
| 2006/0123210 A1 | 6/2006 | Pritchett et al. | |
| 2006/0130133 A1 | 6/2006 | Andreev et al. | |
| 2006/0133374 A1 | 6/2006 | Sekiguchi | |
| 2006/0140193 A1 | 6/2006 | Kakani et al. | |
| 2006/0153201 A1 | 7/2006 | Hepper et al. | |
| 2006/0209669 A1 | 9/2006 | Nishio | |
| 2006/0221832 A1 | 10/2006 | Muller et al. | |
| 2006/0221835 A1 | 10/2006 | Sweeney | |
| 2006/0229861 A1 | 10/2006 | Tatsuoka et al. | |
| 2006/0235996 A1 | 10/2006 | Wolde et al. | |
| 2006/0235998 A1 | 10/2006 | Stechler et al. | |
| 2006/0259320 A1 | 11/2006 | LaSalle et al. | |
| 2006/0268692 A1 | 11/2006 | Wright et al. | |
| 2006/0270341 A1 | 11/2006 | Kim et al. | |
| 2006/0282442 A1 | 12/2006 | Lennon et al. | |
| 2006/0288128 A1 | 12/2006 | Moskalev et al. | |
| 2007/0005807 A1 | 1/2007 | Wong | |
| 2007/0016613 A1 | 1/2007 | Foresti et al. | |
| 2007/0019636 A1 | 1/2007 | Lau et al. | |
| 2007/0038994 A1 | 2/2007 | Davis et al. | |
| 2007/0067771 A1 | 3/2007 | Kulbak et al. | |
| 2007/0112775 A1 | 5/2007 | Ackerman | |
| 2007/0124415 A1 | 5/2007 | Lev-Ran et al. | |
| 2007/0124502 A1 | 5/2007 | Li | |
| 2007/0130255 A1 | 6/2007 | Wolovitz et al. | |
| 2007/0147246 A1 | 6/2007 | Hurley et al. | |
| 2007/0162891 A1 | 7/2007 | Burner et al. | |
| 2007/0168320 A1 | 7/2007 | Borthakur et al. | |
| 2007/0168525 A1 | 7/2007 | DeLeon et al. | |
| 2007/0192543 A1 | 8/2007 | Naik et al. | |
| 2007/0233826 A1 | 10/2007 | Tindal et al. | |
| 2007/0250560 A1 | 10/2007 | Wein et al. | |
| 2008/0004022 A1 | 1/2008 | Johannesson et al. | |
| 2008/0010372 A1 | 1/2008 | Khendouri et al. | |
| 2008/0022059 A1 | 1/2008 | Zimmerer et al. | |
| 2008/0120592 A1 | 5/2008 | Tanguay et al. | |
| 2008/0126509 A1 | 5/2008 | Subramanian et al. | |
| 2008/0141246 A1 | 6/2008 | Kuck et al. | |
| 2008/0184248 A1 | 7/2008 | Barua et al. | |
| 2008/0208917 A1 | 8/2008 | Smoot et al. | |
| 2008/0263401 A1 | 10/2008 | Stenzel | |
| 2008/0270578 A1 | 10/2008 | Zhang et al. | |
| 2008/0281908 A1 | 11/2008 | McCanne et al. | |
| 2008/0281944 A1 | 11/2008 | Vome et al. | |
| 2009/0003204 A1 | 1/2009 | Okholm et al. | |
| 2009/0016217 A1 | 1/2009 | Kashyap | |
| 2009/0080440 A1 | 3/2009 | Balyan et al. | |
| 2009/0089487 A1 | 4/2009 | Kwon et al. | |

(56) References Cited

U.S. PATENT DOCUMENTS

| | | | |
|---|---|---|---|
| 2009/0089619 A1 | 4/2009 | Huang et al. | |
| 2009/0094311 A1 | 4/2009 | Awadallah et al. | |
| 2009/0097480 A1 | 4/2009 | Curtis et al. | |
| 2009/0106413 A1 | 4/2009 | Salo et al. | |
| 2009/0125955 A1 | 5/2009 | DeLorme | |
| 2009/0138314 A1 | 5/2009 | Bruce | |
| 2009/0161542 A1 | 6/2009 | Ho | |
| 2009/0187915 A1 | 7/2009 | Chew et al. | |
| 2009/0217163 A1 | 8/2009 | Jaroker | |
| 2009/0217386 A1 | 8/2009 | Schneider | |
| 2009/0222598 A1 | 9/2009 | Hayden | |
| 2009/0241176 A1 | 9/2009 | Beletski et al. | |
| 2009/0248911 A1 | 10/2009 | Conroy et al. | |
| 2009/0265396 A1 | 10/2009 | Ram et al. | |
| 2009/0265467 A1 | 10/2009 | Peles | |
| 2009/0289828 A1 | 11/2009 | Hinchey | |
| 2009/0292957 A1 | 11/2009 | Bower et al. | |
| 2009/0300161 A1 | 12/2009 | Pruitt et al. | |
| 2009/0316708 A1 | 12/2009 | Yahyaoui et al. | |
| 2009/0319600 A1 | 12/2009 | Sedan et al. | |
| 2010/0042743 A1 | 2/2010 | Jeon et al. | |
| 2010/0061232 A1 | 3/2010 | Zhou et al. | |
| 2010/0064001 A1 | 3/2010 | Daily | |
| 2010/0070476 A1 | 3/2010 | O'Keefe et al. | |
| 2010/0082849 A1 | 4/2010 | Millet et al. | |
| 2010/0093318 A1 | 4/2010 | Zhu et al. | |
| 2010/0094945 A1 | 4/2010 | Chan et al. | |
| 2010/0131654 A1 | 5/2010 | Malakapalli et al. | |
| 2010/0179984 A1 | 7/2010 | Sebastian | |
| 2010/0228814 A1 | 9/2010 | McKenna et al. | |
| 2010/0228819 A1 | 9/2010 | Wei | |
| 2010/0242092 A1 | 9/2010 | Harris et al. | |
| 2010/0250497 A1 | 9/2010 | Redlich et al. | |
| 2010/0274772 A1 | 10/2010 | Samuels | |
| 2010/0306169 A1 | 12/2010 | Pishevar et al. | |
| 2011/0055921 A1 | 3/2011 | Narayanaswamy et al. | |
| 2011/0066736 A1 | 3/2011 | Mitchell et al. | |
| 2011/0072321 A1 | 3/2011 | Dhuse | |
| 2011/0075667 A1 | 3/2011 | Li et al. | |
| 2011/0078303 A1 | 3/2011 | Li et al. | |
| 2011/0098087 A1 | 4/2011 | Tseng | |
| 2011/0113095 A1 | 5/2011 | Hatami-Hanza | |
| 2011/0185082 A1 | 7/2011 | Thompson | |
| 2011/0188415 A1 | 8/2011 | Graziano | |
| 2011/0213911 A1 | 9/2011 | Eldus et al. | |
| 2012/0117028 A1 | 5/2012 | Gold et al. | |
| 2012/0150805 A1 | 6/2012 | Pafumi et al. | |
| 2012/0195273 A1 | 8/2012 | Iwamura et al. | |
| 2012/0197965 A1* | 8/2012 | McCanne | H03M 7/30 709/202 |
| 2012/0254293 A1 | 10/2012 | Winter et al. | |
| 2012/0257506 A1 | 10/2012 | Bazlamacci et al. | |
| 2012/0258766 A1 | 10/2012 | Cho et al. | |
| 2013/0058229 A1 | 3/2013 | Casado et al. | |
| 2013/0182713 A1 | 7/2013 | Giacomoni et al. | |
| 2013/0238472 A1 | 9/2013 | Fan et al. | |
| 2014/0071895 A1 | 3/2014 | Bane et al. | |
| 2014/0099945 A1 | 4/2014 | Singh et al. | |
| 2014/0105069 A1 | 4/2014 | Potnuru | |
| 2014/0187199 A1 | 7/2014 | Yan et al. | |
| 2014/0286316 A1 | 9/2014 | Park et al. | |
| 2015/0058595 A1 | 2/2015 | Gura et al. | |

FOREIGN PATENT DOCUMENTS

| | | |
|---|---|---|
| EP | 0605088 | 2/1996 |
| EP | 0605088 A3 | 2/1996 |
| EP | 1081918 | 8/2000 |
| EP | 1081918 A2 | 8/2000 |
| EP | 1813084 | 8/2007 |
| JP | 6205006 | 7/1994 |
| JP | 6205006 A3 | 7/1994 |
| JP | 821924 | 3/1996 |
| JP | 821924 B2 | 3/1996 |
| JP | 2000/183935 | 6/2000 |
| JP | 2000183935 A3 | 6/2000 |
| WO | 0058870 | 3/2000 |
| WO | WO 0058870 | 3/2000 |
| WO | 200239696 A2 | 5/2002 |
| WO | WO 2002/39696 | 5/2002 |
| WO | WO 2006/055494 | 5/2006 |
| WO | 2006091040 A1 | 8/2006 |
| WO | WO 2006/091040 | 8/2006 |

OTHER PUBLICATIONS

"Diameter MBLB Support Phase 2: Generic Message Based Load Balancing (GMBLB)", last accessed Mar. 29, 2010, pp. 1-10, (http://peterpan.f5net.com/twiki/bin/view/TMOS/TMOSDiameterMBLB).

F5 Networks Inc., "Using F5's-DNS Controller to Provide High Availability Between Two or More Data Centers", F5 Networks Inc., Aug. 2001, pp. 1-4, Seattle, Washington, (http://www.f5.com/f5products/3dns/relatedMaterials/3DNSRouting.html).

F5 Networks Inc., "Routing Global Internet Users to the Appropriate Data Center and Applications Using F5's 3-DNS Controller", F5 Networks Inc., Aug. 2001, pp. 1-4, Seattle, Washington, (http://www.f5.com/f5producs/3dns/relatedMaterials/UsingF5.html).

F5 Networks Inc., "Case Information Log for 'Issues with BoNY upgrade to 4.3'", as early as Feb. 2008.

Gupta et al., "Algorithms for Packet Classification", Computer Systems Laboratory, Stanford University, CA, Mar./Apr. 2001, pp. 1-29.

LaMonica M., "Infravio spiffs up Web services registry idea", CNET News.com, May 11, 2004, pp. 1-2, (http://www.news.com).

Rosen E., et al., "MPLS Label Stack Encoding", (RFC:3032) Network Working Group, Jan. 2001, pp. 1-22, (http://www.ietf.org/rfc/rfc3032.txt).

Sommers F., "Whats New in UDDI 3.0—Part 1", Web Services Papers, Jan. 27, 2003, pp. 1-4, (http://www.webservices.org/index.php/article/articleprint/871/-1/241).

U.S. Appl. No. 13/771,538 to Michels et al., filed Feb. 20, 2013.
U.S. Appl. No. 14/032,329 to Masters et al., filed Sep. 20, 2013.
U.S. Appl. No. 14/038,433 to Amdahl, filed Sep. 26, 2013.
U.S. Appl. No. 14/194,268 to Ridel et al., filed Feb. 28, 2014.
U.S. Appl. No. 14/081,700 to McCann filed Nov. 15, 2013.
U.S. Appl. No. 14/139,228 to Lewites et al., filed Dec. 23, 2014.
U.S. Appl. No. 14/144,137 to Amdahl, filed Dec. 30, 2013.

"Cavium Networks Product Selector Guide—Single & Multi-Core MIPS Processors, Security Processors and Accelerator Boards," 2008, pp. 1-44, Cavium Networks, Mountain View, CA, US.

"Chapter 15, Memory Mapping and DMA," Memory Management in Linux, ch15.13676, accessed on Jan. 25, 2005, pp. 412-463.

"Comtech AHA Announces 3.0 Gbps GZIP Compression/Decompression Accelerator AHA362-PCIX offers high-speed GZIP compression and decompression," www.aha.com, Apr. 20, 2005, pp. 1-2, Comtech AHA Corporation, Moscow, ID, USA.

"Comtech AHA Announces GZIP Compression and Decompression IC Offers the highest speed and compression ratio performance in hardware on the market," www.aha.com, Jun. 26, 2007, pp. 1-2, Comtech AHA Corporation, Moscow, ID, USA.

"Diameter MBLB Support Phase 2: Generic Message Based Load Balancing (GMBLB)", last accessed Mar. 29, 2010, pp. 1-10, (http://peterpan.f5net.com/twiki/bin/view/TMOSTTMOSDiameterMBLB).

"DMA and Interrupt Handling," <http://www.eventhelix.com/RealtimeMantra/FaultHandling/dma_interrupt_handling.htm>, Jan. 29, 2010, pp. 1-4, EventHelix.com.

"Gigabit Ethernet/PCI Network Interface Card; Host/NIC Software Interface Definition," Jul. 1999, pp. 1-80, Revision 12.4.13, P/N 020001, Alteon WebSystems, Inc., San Jose, California.

"Layer 4/7 Switching and Other Custom IP Traffic Processing using the NEPPI API," Bell Laboratories, Lucent Technologies, pp. 1-11, Murray Hill, NJ.

"Market Research & Releases, CMPP PoC documentation", last accessed Mar. 29, 2010, (http://mainstreet/sites/PD/Teams/ProdMgmt/MarketResearch/Universal).

(56) References Cited

OTHER PUBLICATIONS

"Market Research & Releases, Solstice Diameter Requirements", last accessed Mar. 29, 2010, (http://mainstreet/sites/PD/Teams/ProdMgmt/MarketResearch/Unisversal).

"NITROX™ XL Security Acceleration Modules PCI 3V or 3V/5V-Universal Boards for SSL and IPSec," at http://www.Caviumnetworks.com, 2002, pp. 1, Cavium Networks, Mountain View, CA USA.

"PCI, PCI-X," at http://www.cavium.com/acceleration-boards-PCI-PCI-X.htm (Downloaded Oct. 2008), Cavium Networks—Products > Acceleration Boards > PCI, PCI-X.

"Plan 9 kernel history: overview / file list / diff list," <http://switch.com/cgi-bin/plan9history.cgi?f=2001/0126/pc/etherga620.com>, accessed Oct. 22, 2007, pp. 1-16.

"Respond to server depending on TCP::client_port", DevCentral Forums iRules, pp. 1-6, last accessed Mar. 26, 2010, (http://devcentral.f5.com/Default/aspx?tabid=53&forumid=5&tpage=1&v).

"TCP—Transmission Control Protocol (TCP Fast Retransmit and Recovery)," Mar. 28, 2002, pp. 1-5, EventHelix.com.

"UDDI Overview", Sep. 6, 2000, pp. 1-21, uddi.org, (http://www.uddi.org/).

"UDDI Technical White Paper," Sep. 6, 2000, pp. 1-12, uddi-org, (http://www.uddi.org/).

"UDDI Version 3.0.1", UDDI Spec Technical Committee Specification, Oct. 14, 2003, pp. 1-383, uddi.org, (http://www.uddi.org/).

Baer, T., et al., "The elements of Web services" ADTmag.com, Dec. 1, 2002, pp. 1-6, (http://www.adtmag.com).

Blue Coat, "Technology Primer: CIFS Protocol Optimization," Blue Coat Systems Inc., 2007, last accessed: Sep. 2013, pp. 1-3, (http://www.bluecoat.com).

F5 Networks Inc., "3-DNS® Reference Guide, version 4.5", F5 Networks Inc., Sep. 2002, pp. 2-1-2-28, 3-1-3-12, 5-1-5-24, Seattle, Washington.

F5 Networks Inc., "Big-IP® Reference Guide, version 4.5", F5 Networks Inc., Sep. 2002, pp. 11-1-11-32, Seattle, Washington.

F5 Networks Inc., "Case Information Log for Issues with BoNY upgrade to 4.3", as early as Feb. 2008.

F5 Networks Inc., "Deploying the BIG-IP LTM for Diameter Traffic Management," F5® Deployment Guide, Publication date Sep. 2010, Version 1.2, pp. 1-19.

F5 Networks Inc., "F5 Diameter RM", Powerpoint document, Jul. 16, 2009, pp. 1-7.

F5 Networks Inc., "F5 WANJet CIFS Acceleration", White Paper, F5 Networks Inc., Mar. 2006, pp. 1-5, Seattle, Washington.

F5 Networks Inc., "Routing Global Internet Users to the Appropriate Data Center and Applications Using F5's 3-DNS Controller", F5 Networks Inc., Aug. 2001, pp. 1-4, Seattle, Washington, (http://www.f5.com/f5producs/3dns/ relatedMaterials/UsingF5.html).

F5 Networks Inc., "Using F5's 3-DNS Controller to Provide High Availability Between Two or More Data Centers", F5 Networks Inc., Aug. 2001, pp. 1-4, Seattle, Washington, (http://www.f5.com/f5products/3dns/ relatedMaterials/3DNSRouting.html).

Fajardo V., "Open Diameter Software Architecture," Jun. 25, 2004, pp. 1-6, Version 1.0.7.

Gupta et al., "Algorithms for Packet Classification", Computer Systems Laboratory, Stanford University, CA, Mar./ Apr. 2001, pp. 1-29.

Harvey et al., "DMA Fundamentals on Various PC Platforms," Application Note 011, Apr. 1999, pp. 1-20, National Instruments Corporation.

Heinz G., "Priorities in Stream Transmission Control Protocol (SCTP) Multistreaming", Thesis submitted to the Faculty of the University of Delaware, Spring 2003, pp. 1-35.

Ilvesjmaki M., et al., "On the capabilities of application level traffic measurements to differentiate and classify Internet traffic", Presented in SPIE's International Symposium ITcom, Aug. 19-21, 2001, pp. 1-11, Denver, Colorado.

Internet Protocol, "DARPA Internet Program Protocol Specification", (RFC:791), Information Sciences Institute, University of Southern California, Sep. 1981, pp. 1-49.

Kawamoto, D., "Amazon files for Web services patent", CNET News.com, Jul. 28, 2005, pp. 1-2, (http://news.com).

LaMonica M., "Infravio spiffs up Web services registry idea", CNET News.com, May 11, 2004, pp. 1-2, (http://www. news_com).

MacVittie, Lori, "Message-Based Load Balancing," Technical Brief, Jan. 2010, pp. 1-9, F5 Networks, Inc.

Mangino, John, "Using DMA with High Performance Peripherals to Maximize System Performance," WW TMS470 Catalog Applications, SPNA105 Jan. 2007, pp. 1-23.

Modiano E., "Scheduling Algorithms for Message Transmission Over a Satellite Broadcast System," MIT Lincoln Laboratory Advanced Network Group, Nov. 1997, pp. 1-7.

Mogul, Jeffrey C., "The Case for Persistent-Connection HTTP," SIGCOMM '95, Digital Equipment Corporation Western Research Laboratory, 1995, pp. 1-15, Cambridge, Maine.

Nichols K., et al., "Definition of the Differentiated Services Field (DS Field) in the IPv4 and IPv6 Headers", (RFC:2474) Network Working Group, Dec. 1998, pp. 1-19, (http://www.ietf.org/rfc/rfc2474.txt).

Ott D., et al., "A Mechanism for TCP-Friendly Transport-level Protocol Coordination", USENIX Annual Technical Conference, Jun. 10, 2002, University of North Carolina at Chapel Hill, pp. 1-12.

Padmanabhan V., et al., "Using Predictive Prefetching to Improve World Wide Web Latency", SIGCOM, Jul. 1, 1996, pp. 1-15.

Rabinovich et al., "DHTTP: An Efficient and Cache-Friendly Transfer Protocol for the Web," IEEE/ACM Transactions on Networking, Dec. 2004, pp. 1007-1020, vol. 12, No. 6.

Rosen E, et al., "MPLS Label Stack Encoding", (RFC:3032) Network Working Group, Jan. 2001, pp. 1-22, (http://www.ietf.org/rfc/rfc3032.txt).

Salchow, Jr., KJ, "Clustered Multiprocessing: Changing the Rules of the Performance Game," F5 White Paper, Jan. 2008, pp. 1-11, F5 Networks, Inc.

Schilit B., "Bootstrapping Location-Enhanced Web Services", University of Washington, Dec. 4, 2003, (http://www.cs.washington.edu/news/colloq.info.html).

Seeley R., "Can Infravio technology revive UDDI?", ADTmag.com, Oct. 22, 2003, (http://www.adtmag.com).

Shohoud, Y., "Building XML Web Services with VB .NET and VB 6", Addison Wesley, Sep. 2002, pp. 1-14.

Sleeper B., "The Evolution of UDDI", UDDI.org White Paper, The Stencil Group, Inc., Jul. 19, 2002, pp. 1-15, San Francisco, California.

Sleeper B., "Why UDDI Will Succeed, Quietly: Two Factors Push Web Services Forward", The Stencil Group, Inc., Apr. 2001, pp. 1-7, San Francisco, California.

Sommers F., "Whats New in UDDI 3.0—Part 1", Web Services Papers, Jan. 27, 2003, pp. 1-4, (http://www. webservices.org/index.php/article/articleprint/871/-1/24/).

Sommers F., "Whats New in UDDI 3.0—Part 2", Web Services Papers, Mar. 2, 2003, pp. 1-8, (http://www.web.archive.org/web/20040620131006/).

Sommers F., "Whats New in UDDI 3.0—Part 3", Web Services Papers, Sep. 2, 2003, pp. 1-4, (http://www.webservices.org/index.php/article/articleprint/894/-1/24/).

Stevens, W., "TCP Slow Start, Congestion Avoidance, Fast Retransmit, and Fast Recovery Algorithms," Network Working Group, RFC 2001, Jan. 1997, pp. 1-6.

Wadge, Wallace, "Achieving Gigabit Performance on Programmable Ethernet Network Interface Cards," May 29, 2001, pp. 1-9.

Wang B., "Priority and realtime data transfer over the best-effort Internet", Dissertation Abstract, ScholarWorks@UMASS, Sep. 2005, pp. i-xiv and pp. 1-9.

Welch, Von, "A User's Guide to TCP Windows," http://www.vonwelch.com/report/tcp_windows, updated 1996, last accessed Jan. 29, 2010, pp. 1-5.

Wikipedia, "Diameter (protocol)", pp. 1-11, last accessed Oct. 27, 2010, (http://en.wikipedia.org/wiki/Diameter_(protocol)).

Wikipedia, "Direct memory access," <http://en.wikipedia.org/wiki/Direct_memory_access>, accessed Jan. 29, 2010, pp. 1-6.

(56) References Cited

OTHER PUBLICATIONS

Wikipedia, "Nagle's algorithm," <http://en.wikipedia.org/wiki/Nagle%27s_algorithm>, 2 pages.

Woo T.Y.C., "A Modular Approach to Packet Classification: Algorithms and Results", Nineteenth Annual Conference of the IEEE Computer and Communications Societies 3(3):1213-22, Mar. 26-30, 2000, abstract only, (http://ieeexplore.ieee.org/xpl/freeabs_all.jsp?arnumber=832499).

Bell Laboratories, "Layer 4/7 Switching and Other Custom IP Traffic Processing Using the NEPPI API," Bell Laboratories, Lucent Technologies, Murray Hill, NJ 07974 USA, pp. 1-11 (2000).

Wikipedia, "Nagle's algorithm," https://en.wikipedia.org/wiki/Nagle%27s_algorithm 2 Pages. Dec. 14, 2014.

\* cited by examiner

SYSTEM AND METHOD FOR UTILIZING A DATA REDUCING MODULE FOR DICTIONARY COMPRESSION OF ENCODED DATA

STATEMENT OF RELATED APPLICATION

The present application claims the benefit of priority based on U.S. Provisional Patent Application Ser. No. 61/707,890, filed on Sep. 29, 2012, in the name of Saxon Amdahl, entitled "System and Method for Utilizing a Data Reducing Module for Dictionary Compression of Encoded Data", which is hereby incorporated by reference in its entirety.

FIELD

The present disclosure is directed to a system and method for utilizing a data reducing module for dictionary compression of encoded data.

BACKGROUND

Symmetric data deduplication technology is used between network traffic management devices that have web acceleration functionality. In particular, deduplication technology is used to reduce the amount of bandwidth consumed between the web accelerator devices across a wide area network, especially for repeated data transfers. Although deduplication technology works well, such existing technologies are subject to scaling challenges, especially in large mesh networks.

What is needed is a system and method that utilizes deduplication technology that is easily scalable for large mesh networks.

SUMMARY

In an aspect, a method of performing dictionary compression utilizing identifier and data length information is disclosed. The method comprises handling, at a transmitter device (TD), a data stream to be transmitted over a network to a receiver device (RD), wherein the data stream includes a plurality of content data bytes. The method comprises selecting a first data segment in the data stream having a universal first identifier and data length information and a corresponding first plurality of content data bytes. The method comprises querying a global bloom filter of the TD to determine if the RD has a stored copy of the first plurality of content data bytes and the corresponding first identifier and data length information for the first data segment, wherein the global bloom filter indicates that the RD has the stored copy of the first identifier and data length information and first plurality of content data bytes for the first data segment. The method comprises preparing a first encoded data packet, wherein the first encoded data packet includes the first identifier and data length information without the first plurality of content data bytes for the data segment. The method comprises sending the first encoded data packet over a network connection to the RD, wherein the RD utilizes the received first identifier and data length information to retrieve the first plurality of content data bytes associated with the first data segment from the RD's data store and decodes the first data segment to include the first plurality of content data bytes.

In an aspect, a processor readable medium having stored thereon instructions for utilizing universal identifier and data length information associated with content data bytes is disclosed. The medium comprising processor executable code which when executed by at least one processor of a transmitting network device (TD), causes the TD to handle a data stream to be transmitted over the network to a receiver device (RD), wherein the data stream includes a plurality of content data bytes. The TD selects a first data segment in the data stream having an assigned first identifier and data length and a corresponding first plurality of content data bytes. The TD queries a global bloom filter to determine if the RD has a stored copy of the first plurality of content data bytes and the corresponding first identifier and data length for the first data segment, wherein the global bloom filter indicates that the RD has the stored copy of the first identifier and data length and first plurality of content data bytes for the first data segment. The TD prepares a first encoded data packet to send to the RD, wherein the first encoded data packet includes the first identifier and data length without the first plurality of content data bytes for the data segment. The TD instructs the network interface to send the first encoded data packet over a network connection to the RD, wherein the RD utilizes the received first identifier and data length to retrieve the first plurality of content data bytes associated with the first data segment from the RD's data store and decodes the first data segment to include the first plurality of content data bytes.

In an aspect, a transmitter device (TD) configured to communicate compressed data packets to a receiver device (RD) over a network is disclosed. The TD comprises a network interface capable of transmitting compressed data packets over a network to one or more receiver network devices (RD). The TD comprises a memory having stored thereon code embodying machine executable programmable instructions for utilizing universal identifier and data length associated with content data bytes. The TD comprises a processor configured to execute the stored programming instructions in the memory, which when executed by the processor, causes the processor to handle a data stream to be transmitted over the network to the RD, wherein the data stream includes a plurality of content data bytes. The processor further selects a first data segment in the data stream having an assigned first identifier and data length and a corresponding first plurality of content data bytes. The processor further queries a global bloom filter of the TD to determine if the RD has a stored copy of the first plurality of content data bytes and the corresponding first identifier and data length for the first data segment, wherein the global bloom filter indicates that the RD has the stored copy of the first identifier and data length and first plurality of content data bytes for the first data segment. The processor further prepares a first encoded data packet to send to the RD, wherein the first encoded data packet includes the first identifier and data length without the first plurality of content data bytes for the data segment. The processor further instructs the network interface to send the first encoded data packet over a network connection to the RD, wherein the RD utilizes the received first identifier and data length to retrieve the first plurality of content data bytes associated with the first data segment from the RD's data store and decodes the first data segment to include the first plurality of content data bytes.

Figure 1:
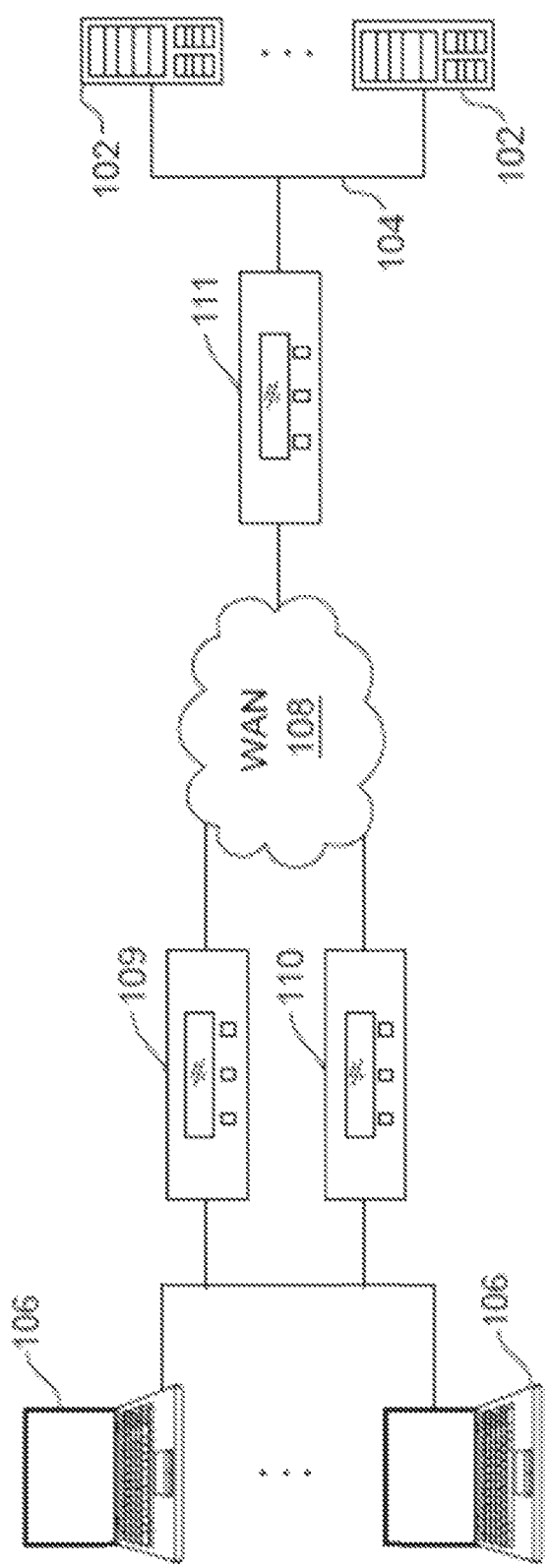
FIG. 1 is a diagram of an example system environment utilizing a data reducer module in accordance with an aspect of the present disclosure.

While these examples are susceptible of embodiments in many different forms, there is shown in the drawings and will herein be described in detail preferred examples with the understanding that the present disclosure is to be considered as an exemplification and is not intended to limit the broad aspect to the embodiments illustrated.

DETAILED DESCRIPTION

FIG. 1 is a diagram of an example system environment that includes a plurality of network traffic management devices in accordance with an aspect of the present disclosure. As shown in FIG. 1, the example system environment 100 employs a plurality of network devices comprising one or more client devices 106, one or more servers 102, and at least three network traffic management devices 109, 110, 111. As shown in FIG. 1, the example environment 100 includes one or more client-side network traffic management devices 109, 110 as well as one or more server-side network traffic management devices 111 which communicate with one another in relation to the present disclosure. The example system environment 100 may include other numbers and types of network devices in other arrangements.

The network traffic management devices 109 and 110 are coupled to the client devices 106 and the network traffic management device 111 is coupled to the servers 102 via a local area network (LAN) 104. Generally, communications sent over the network 108 between client devices 106 and servers 102 are received, handled and transmitted via the network traffic management devices 109, 110, 111.

Client devices 106 comprise network devices capable of connecting to other network devices, such as network traffic management device(s) 109-111 and/or servers 102. Such connections are performed over wired and/or wireless networks, such as network 108, to send and receive data, like Web-based requests, receiving responses to requests and/or performing other tasks. Non-limiting and non-exhausting examples of such client devices 106 include personal computers (e.g., desktops, laptops, tablets), mobile and/or smart phones, smart TVs, stand alone media devices and the like. In an example, client devices 106 run Web browsers that may provide an interface for operators, such as human users, to interact with for making requests for resources to different web server-based applications or Web pages via the network 108, although other server resources may be requested by clients. One or more Web-based applications may run on the server 102 that provide the requested data back to one or more exterior network devices, such as client devices 106, in the form of responses.

The servers 102 comprise one or more server computing machines capable of operating one or more Web-based and/or non Web-based applications that may be accessed by network devices (e.g. client devices, network traffic management devices) over the network 108. The servers 102 may provide other data representing requested resources, such as particular Web page(s), image(s) of physical objects, and any other objects, responsive to requests from other network devices. It should be noted that the server 102 may perform other tasks and provide other types of resources. It should be noted that while only two servers 102 are shown in the environment 100 depicted in FIG. 1, greater or lesser numbers and types of servers may be implemented in the environment 100. It is also contemplated that one or more of the servers 102 may be a cluster of servers managed by one or more network traffic management devices 109-111.

It is to be understood that the one or more servers 102 may be hardware and/or software, and/or may represent a system with multiple servers that may include internal or external networks. In an aspect, the servers 102 may be any version of Microsoft® IIS servers or Apache® servers, although other types of servers may be used. In an aspect, the server 102 utilizes software to allow it run the RADIUS protocol (Remote Access Dial In User Services), DIAMETER protocol and the like to provide authentication, authorization, and accounting (AAA) services for dial-up PPP/IP, Mobile IP access and mobile telecommunications networks. Further, additional servers may be coupled to the network 108 and many different types of applications may be available on servers coupled to the network 108.

As shown in the example environment 100 depicted in FIG. 1, one or more network traffic management devices 109, 110 are interposed between client devices 106 and the network 108, whereas one or more network traffic management devices 111 are interposed, via LAN 104, between the network 108 and the servers 102. Again, the environment 100 could be arranged in other manners with other numbers and types of network devices. It should be understood that the devices and the particular configuration shown in FIG. 1 are provided for exemplary purposes only and thus are not limiting.

Generally, the network traffic management devices 109-111 perform web acceleration functions, but can also perform other functions. Such other functions include, but are not limited to, managing network communications between one another as well as between the client devices 106 and the servers 102, load balancing, access control, validating HTTP requests using JavaScript code and the like. Client requests may be destined for one or more servers 102, and may take the form of one or more data packets over the network 108. The requests pass through one or more intermediate network devices and/or intermediate networks, until they ultimately reach the one or more network traffic management devices 109-111.

Network 108 comprises a publicly accessible network, such as the Internet; however, it is contemplated that the network 108 may comprise other types of private and public networks. Communications, such as requests from clients 106 and responses from servers 102, take place over the network 108 according to standard network protocols, such as the HTTP and TCP/IP protocols in this example. As per the TCP/IP protocols, communications between the client device 106 and the server(s) 102 may be sent as one or more streams of data packets over the network 108, via one or more network traffic management devices 109-111. It is also contemplated that streams of data packets may be sent among network traffic management devices. Such protocols can be used by the network devices to establish connections, send and receive data for existing connections, and the like. However, the principles discussed herein are not limited to this example and can include other protocols.

Further, it should be appreciated that network 108 may include local area networks (LANs), wide area networks (WANs), direct connections and any combination thereof, as well as other types and numbers of network types. On an interconnected set of LANs or other networks, including those based on differing architectures and protocols, routers, switches, hubs, gateways, bridges, and other intermediate network devices may act as links within and between LANs and other networks to enable messages and other data to be sent from and to network devices. Also, communication links within and between LANs and other networks typically include twisted wire pair (e.g., Ethernet), coaxial cable, analog telephone lines, full or fractional dedicated digital lines including T1, T2, T3, and T4, Integrated Services Digital Networks (ISDNs), Digital Subscriber Lines (DSLs), wireless links including satellite links and other communications links known to those skilled in the relevant arts. In essence, the network 108 includes any communication method by which data may travel between client devices 106, servers 102 and network traffic management devices 109-111.

LAN 104 comprises a private local area network that allows communications between the network traffic management device 110 and the one or more servers 102, although the LAN 104 may comprise other types of private and public networks with other devices. Networks, including local area networks, besides being understood by those skilled in the relevant arts, have already been generally described above in connection with network 108 and thus will not be described further.

Figure 2A:
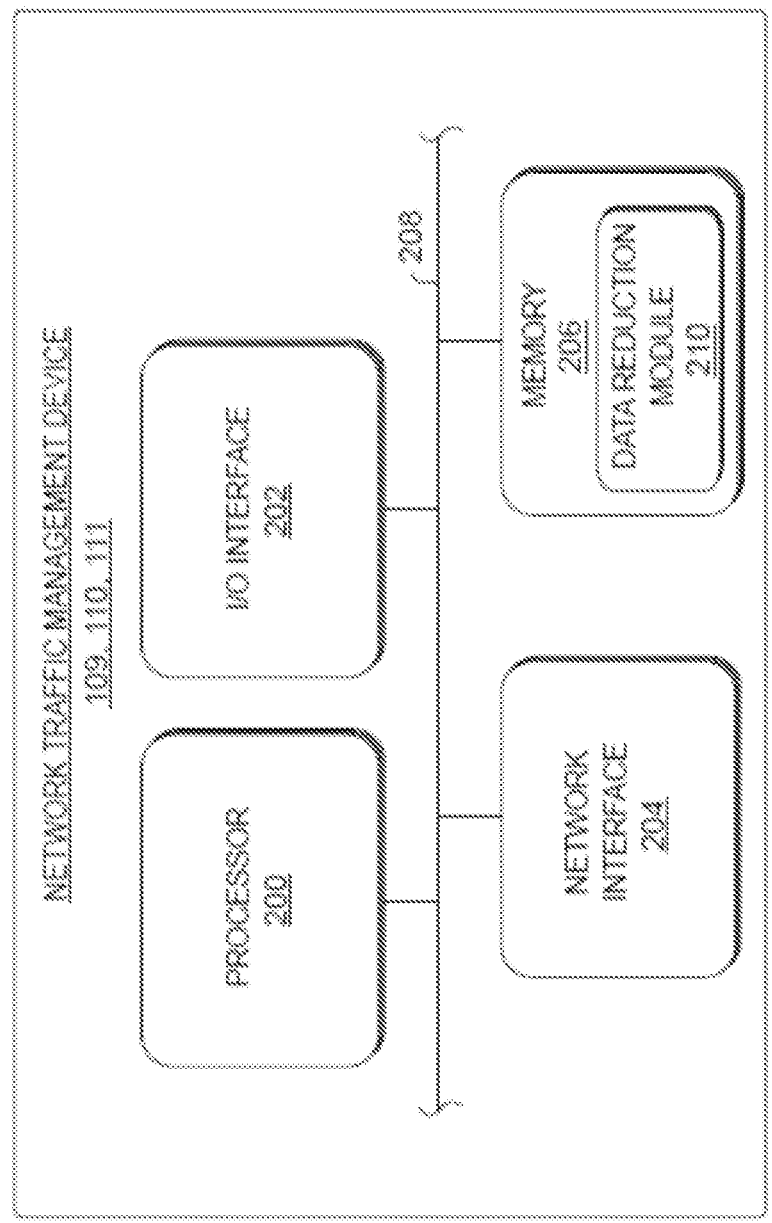
FIG. 2A is a block diagram of a network traffic management device configured to implement the data reducer module in accordance with an aspect of the present disclosure.
Figure 2B:
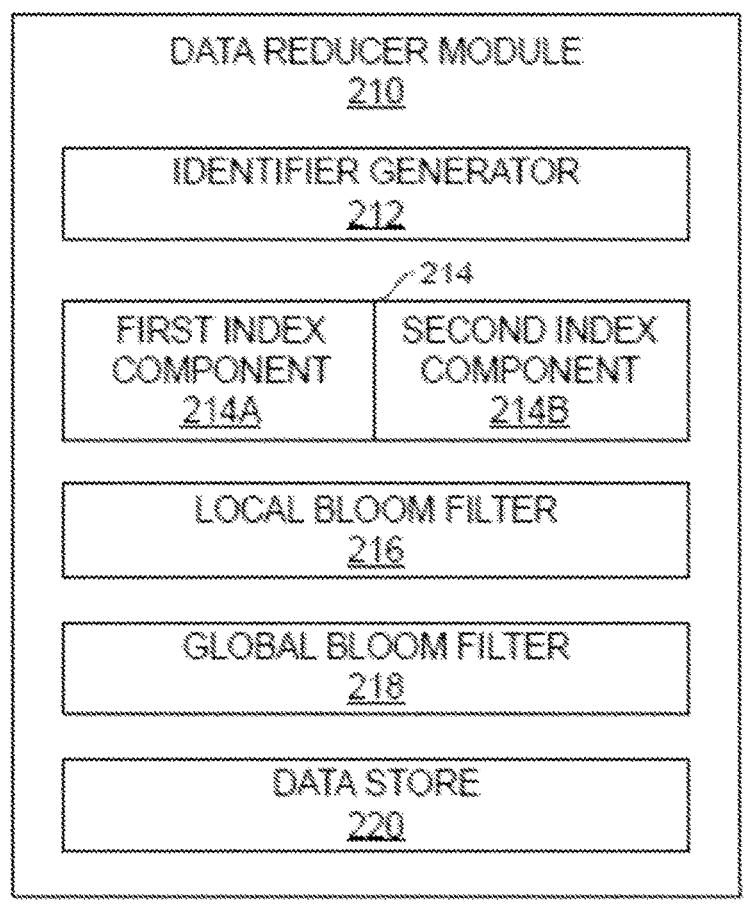
FIG. 2B is a block diagram of the data reducer module in accordance with an aspect of the present disclosure.

FIG. 2A is a block diagram of a network traffic management device shown in FIG. 1 in accordance with the present disclosure. FIG. 2B is a block diagram of the data reduction module of the network traffic management device in accordance with an aspect of the present disclosure. Referring now to FIG. 2A, an example network traffic management device 109-111 includes one or more device processors 200, one or more device I/O interfaces 202, one or more network interface 204 and one or more device memories 206, which are coupled together by bus 208. As shown in FIG. 2A, the network traffic management devices 109-111 include a data reduction module 210 stored in the memory 206, although the data reduction module 210 may alternatively be stored elsewhere within or external to the network traffic management device 109-111. It should be noted that the network traffic management device could include other types and/or numbers of components and is thus not limited to the example shown in FIG. 2A.

Device processor 200 comprises one or more microprocessors or cores configured to execute computer/machine readable and executable instructions stored in device memory 206 or elsewhere. Such instructions, when executed by one or more processors, implement network traffic management related functions of the network traffic management device 109-111. In addition, the instructions of the data reduction module 210, when executed by one or more processors, cause the processor 200 to perform one or more portions of the novel processes described below. The processor 200 may comprise other types and/or combinations of processors, such as digital signal processors, micro-controllers, application specific integrated circuits ("ASICs"), programmable logic devices ("PLDs"), field programmable logic devices ("FPLDs"), field programmable gate arrays ("FPGAs"), and the like.

Device I/O interfaces 202 comprise one or more user input and output device interface mechanisms. The interface may include a computer keyboard, mouse, touchscreen display device, and the corresponding physical ports and underlying supporting hardware and software to enable the network traffic management device 109-111 to communicate with the outside environment. Such communication may include accepting user data input and to provide user output, although other types and numbers of user input and output devices may be used.

Network interface 204 comprises one or more mechanisms that enable the one or more network traffic management devices 109-111 to engage in network communications over the LAN 104 and the network 108 using one or more desired protocols (e.g. TCP/IP, UDP, HTTP, RADIUS, DNS). However, it is contemplated that the network interface 204 may be constructed for use with other communication protocols and types of networks. Network interface 204 is sometimes referred to as a transceiver, transceiving device, or network interface card (NIC), which transmits and receives network data packets to one or more networks, such as LAN 104 and network 108. In an example where the one or more network traffic management devices 109-111 include more than one device processor 200 (or a processor 200 has more than one core), each processor 200 (and/or core) may use the same single network interface 204 or a plurality of network interfaces 204. Further, the network interface 204 may include one or more physical ports, such as Ethernet ports, to couple the one or more network traffic management devices 109-111 with other network devices, such as servers 102/client devices 106. Moreover, the interface 204 may include certain physical ports dedicated to receiving and/or transmitting certain types of network data, such as device management related data for configuring the one or more network traffic management devices 109-111 and/or client request/server response related data.

Bus 208 may comprise one or more internal device component communication buses, links, bridges and supporting components, such as bus controllers and/or arbiters. The bus enables the various components of the one or more network traffic management devices 109-111, such as the processor 200, device I/O interfaces 202, network interface 204, and device memory 206, to communicate with one another. However, it is contemplated that the bus may enable one or more components of the one or more network traffic management devices 109-111 to communicate with components in other devices as well. Example buses include HyperTransport, PCI, PCI Express, InfiniBand, USB, Firewire, Serial ATA (SATA), SCSI, IDE and AGP buses. However, it is contemplated that other types and numbers of buses may be used, whereby the particular types and arrangement of buses will depend on the particular configuration of the one or more network traffic management devices 109-111.

Device memory 206 comprises non-transitory computer readable media, namely non-transitory computer readable or processor readable storage media, which are examples of machine-readable storage media. Computer readable storage/machine-readable storage media may include volatile, nonvolatile, removable, and non-removable media implemented in any method or technology for storage of information. Such storage media includes computer readable/machine-executable instructions, data structures, program modules, or other data, which may be obtained and/or executed by one or more processors, such as device processor 200. Such instructions, when executed by one or more processors, causes or allows the network traffic management device 109-111 to perform actions including implementing an operating system for controlling the general operations, manage network traffic, implement the data reduction module 210, and perform the process described in the following description in accordance with the present disclosure. Examples of non-transitory computer readable storage media include one or more types of RAM, BIOS, ROM, EEPROM, flash/firmware memory or other memory technology, CD-ROM, digital versatile disks (DVD) or other optical storage, magnetic cassettes, magnetic tape, magnetic disk storage or other magnetic storage devices, or any other medium which can be used to store the information.

The data reduction module 210 is depicted in FIG. 2A as being within memory 206 for exemplary purposes only; it should be appreciated the module 210 may be alternatively located elsewhere. For instance, the data reduction module 210 may be located and executed on a client device 106 or server 102, as opposed to the network traffic management devices 109-111, in accordance with an aspect of the present disclosure. Generally, instructions embodying the data reduction module 210 are executed by the device processor 200 to execute the process described herein. With regard to the discussion below, the environment utilizes one or more network traffic management devices which transmit ("transmitting device") encoded compressed data to one or more receiving network traffic management devices ("receiving device") over an established TCP/IP (or other appropriate network protocol) connection. With respect to the environment shown in FIG. 1, the transmitting device is described herein as network traffic management device 111 whereas the receiving device is described herein as network traffic management device 110. It should be noted, however, that network traffic management device 110 may be considered the transmitting device whereas network traffic management device 111 may be considered the receiving device. It should be noted, however, that network traffic management device 109 can also perform the functions associated with transmitting compressed encoded data and/or receiving compressed encoded data in accordance with the present disclosure.

FIG. 2B illustrates a block diagram of the data reduction module of the network traffic management device in accordance with an aspect of the present disclosure. As shown in FIG. 2B, the data reduction module 210 includes one or more software components including an identifier generator 212, an index component 214 including a first index component 214A and a second index component 214B, a local bloom filter 216, a global bloom filter 218, and a data store 220. It should be noted that the above identified components are defined for explanation purposes, and these components of the data reduction module 210 need not be organized into discreet, individual components for actual implementation purposes.

In an aspect, the network traffic management devices 110, 111 utilize the data reduction module 210 to effectively compress or decompress encoded data packets using a dictionary compression technique involving a universal identifier and data length that is sent from a transmitting device to a receiving device. The identifier represents a virtual address, wherein the virtual address plus the data length is what is utilized to encode and replace the bytes, associated with content data. The receiver device determines if it has a local copy of the content data when it finds a matching identifier and data length in its local index.

In particular, a chunk of data that is to be encoded and sent from one network traffic management device, say device 111, to another network traffic management device, say device 110, is first processed by the transmitter's 111 identifier generator 212. In an aspect, the identifier generator 212 determines selective length segments of repetitive and/or redundant data for use in compressing the data into discrete data structures. Potential starting positions within input data are examined by the identifier generator 212, wherein the identifier generator 212 selects a series of bytes of data as a candidate input matching data segment for data encoding. The selected series of bytes of data may be determined utilizing a best fitness function within a sliding window to identify beginning and ending boundaries for the data segment. In other words, the fitness function evaluates a at least a portion of the series of bytes in which the bytes have a repeating pattern that may be present in other data streams. Upon identifying a byte pattern that is appropriate, the identifier generator 212 generates an encoded representation of that byte pattern, which is described herein as the universal identifier. In an aspect, the identifier is a strong identifier in that it has a relatively low probability of representing another byte pattern. The identifier generator 212 performs this process on the data stream to be transmitted, wherein portions of the data stream are converted into a plurality of data segments, each of which having a corresponding unique generated identifier. Details of the identifier generation process and fitness function technique are described in U.S. Pat. No. 7,882,084 entitled, "Compression of Data Transmitted Over a Network" owned by F5 Networks, Inc.

Along with the identifier, the identifier generator 212 also determines a length value which indicates the length of the content data associated with the corresponding identifier. As will be discussed below, the generated identifiers, as well as their associated offset and content data information, is shared among communicating network traffic management devices 110, 111 to achieve efficient encoding.

In an aspect, the data reduction module 210 stores the content data bytes of a particular data segment in the data store 220. Additionally, the data reduction module 210 stores the generated identifier and byte length for the corresponding content data in one or more index components 214. The index component 214 of the network traffic management device 109-111 allows look up functions to be performed with respect to the content data stored in the data store 220.

In an aspect, the index component 214 may be configured as a first index component 214A and a second index component 214B. In this aspect, the first index component 214A contains a table of entries, in which each entry contains an identifier and storage location information contains an index which provides offset information of each stored identifier's data and length data information. In this aspect, the first index component may be housed and executed in local RAM, whereas the second index component may be housed and executed on a separate hardware memory that is not in the local RAM of the device 109-111. It should be noted that the first and second index components are exemplary and it is contemplated that the functions of the first and second index components can be incorporated into one data structure.

The data store 220 is configured to store the content data bytes of each compressed data segment. In an aspect, the bytes of the data segments are stored sequentially in the data store 220 in the same sequential order as they are received in the data stream. In an aspect, the data store 220 is within the network traffic management device, although it is contemplated that the data store is located remotely from the network traffic management device. As will be described, portions of the data store are reserved based on the size of the encoded content, although the location(s) in the data store where the data is stored may not be preestablished. In an aspect, at least a portion of the data store 220 is configured to operate in RAM, as opposed to long term memory. In an aspect, the data store 220 may be configured to have a plurality of segments, wherein each segment has an allocated size to allow storage of a corresponding number of bytes. In such an aspect, the segments have a size of 1 MB, although other allocated sizes of greater or lesser amount are contemplated. Additionally, more than one index (e.g., primary and secondary index values) can be used and stored by the data store 220.

As will be discussed in more detail below, the data reduction module 210 in the transmitter device 111 analyzes the data stream and identifies data segments that contain a pattern of content data bytes that match data segments that have associated identifier and data length information. The transmitter device 111 replaces those content data bytes with a generated identifier and data length information to compress the data stream. In particular, the transmitter's 111 data reduction module 210 writes the identifier and data length information along with the ID of the receiving device 110 into a compressed data packet to ensure proper delivery of the compressed data packet to the receiver 110.

As shown in FIG. 2B, the network traffic management device 110, 111 includes a local bloom filter 216 and a global bloom filter 218. In particular, the local bloom filter 216 is a data structure in the network traffic management device which informs the network traffic management device whether identifier and data length information and associated content data of a particular data segment is stored in that network traffic management device's data store 220. In an aspect, the network traffic management device's local bloom filter 216 will set one or more bits to a true or false value based on whether the identifier and data length information as well as the actual content data are stored in that network traffic management device's data store 220. As will be discussed in more detail below, the local bloom filter 216 of a particular network traffic management device may be shared with one or more other network traffic management devices to provide a global or world view of the identifier and data length information stored in that device.

The global bloom filter 218 is a data structure in the network traffic management device which keeps track of whether one or more other network traffic management device(s) has a copy of the identifier and data length information as well as corresponding content data for a particular data segment in that other network traffic management device's data store 220. If it is determined in network traffic management device's (say device 111) global bloom filter 218 that another network traffic management device (say device 110) has a locally stored copy of the identifier and data length information of a particular data segment, the global bloom filter 218 of network traffic management device (say device 111) will be updated, whereby an assigned one or more bits for device 110 for that data segment will be set to a true value. In contrast, if it is determined that device 110 does not have a copy of the identifier and data length information for that particular data segment, device's 111 global bloom filter 218 will have one or more bits set to a false value. Additionally, one or more of the bits may be set as a result of a collision.

As mentioned above, the receiving device 110 provides information updates to the transmitting device 111 to notify the transmitting device 111 that the identifier and data length information for a particular data segment has been received and stored locally in the receiving device's 110 index components. In one aspect, the receiver's 110 data reduction module 210 sends a "store" message to the transmitting device 111 in which the 'store' message identifies the receiving device 110 and notifies the transmitter 111 that the identifier and data length information were successfully processed by the receiving device 110. The 'store' message is then stored in the transmitter's cache and the transmitter's global bloom filter 218 gets updated to indicate that particular device 110 as having the identifier and data length information.

In another aspect, the transmitter device 111 receives update information from the receiver device 110 in the form of a bloom filter update, wherein a copy of the receiver's 110 local bloom filter 216 is sent to the transmitting device 111 and merged with the transmitting device's 111 global bloom filter 218. This is discussed below in relation to FIG. 6.

In an aspect, the data reduction module 210 in the transmitter device 111 marks, reserves, pins or otherwise locks the identifier and data length information for a compressed data segment it has sent until the transmitter device 111 receives an acknowledgement message from the receiver 110, indicating that the identifier and data length information has been processed. This prevents the locked identifier and data length information from being erased, deleted or overwritten in the transmitter 111 until the transmitter 111 receives the acknowledgement message. Once the acknowledgement message is received at the transmitter device 111, its data reduction module 210 will unlock or otherwise remove the reservation placed on the data segment's identifier and data length information, thereby allowing such information to be deleted, erased or overwritten.

In another aspect, the transmitter 111 stores confirmation information, and/or information regarding outstanding references, for one or more data packets locally and uses the information to perform reference accounting, thereby allowing network traffic management devices 110, 111 to maintain status information of the sent encoded data packets even in the event that there is a connection failure/termination between the receiver 110 and transmitter 111. In other words, segments are pinned by the flow due to outstanding references, which prevents pruning of referenced data. In particular, each generated reference adds to the reference count for a segment, wherein each ACK that is received on the connection decrements the reference count. If flow ends, all of the outstanding references in the flow are removed, and if one or more old references exist, the device will send a probe to see if the peer 'forgot' to send an ACK message.

In particular to the example aspect, the data reduction module 210 of the transmitter 111 writes confirmation information identifying the flow, the particular data segment and an unconfirmed value representing the number of content data bytes which are locked for that data segment, into the header of the encoded data packet being sent to the receiver 110. In this aspect, the transmitter's 111 data reduction module 210 also assigns the same unconfirmed value to the data segment in its data store 220. In this aspect, for each successfully decoded and written content data byte at the receiver 110, the receiver's 110 data reduction module 210 monitors and updates a confirm value for the corresponding data segment that is then written in the header of the response which is sent over the network back to the transmitter 111. The transmitter 111, upon processing the header, will identify the corresponding data segment and decrement the associated unconfirmed value for each ACK message received from the receiver 110.

For example, for a data segment A containing 3 content data bytes, the receiver 110 will set the confirm value in the header to a value of 3 for data segment A. Upon processing the received confirmation message, the transmitter's 111 data reduction module 210 processes the header to identify the data segments and their confirm value. For each content data byte that is confirmed in the confirmation message, the transmitter's 111 data reduction module 210 decrements the unconfirmed value in its data store 220 upon receiving an ACK message from the receiver 110.

Figure 3:
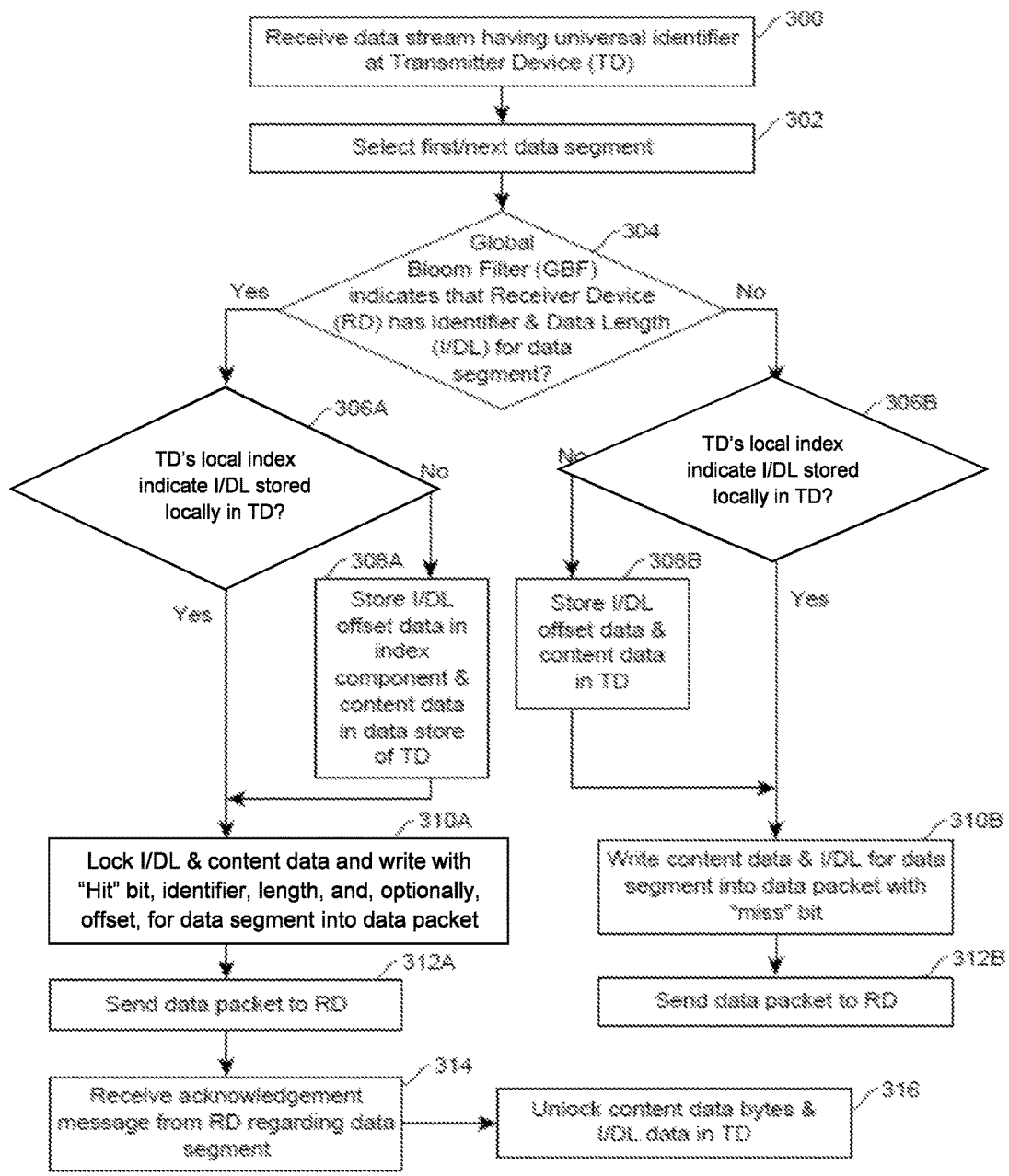
FIG. 3 illustrates a flow chart representing the process of transmitting data packets in accordance with an aspect of the present disclosure.

FIG. 3 illustrates a flow chart representing the process of transmitting compressed encoded data packets in accordance with an aspect of the present disclosure. As shown in FIG. 3, the process is performed in a network traffic management device 111 which is preparing to transmit compressed data segments to a receiving network traffic management device 110. As shown in FIG. 3, a series of bytes of a data stream that is to be transmitted by the transmitting network traffic management device 111 is received by the transmitter's 111 data reduction module 210 (Block 300). In an aspect, the series of bytes of data is of a length that fills a buffer (not shown) in the transmitting device 111 that is to be sent to the receiving device 110. The data stream comprises a plurality of data segments, in that each data segment comprises a plurality of content data bytes.

In an aspect, the data reduction module 210 of the transmitting device 111 receives a data segment in the data stream and analyzes it to identify the unique identifier assigned to it (Block 302). Upon identifying that data segment's identifier, the data reduction module 210 of the transmitting device 111 queries its own global bloom filter 218 to determine if the receiver device 110 has a locally stored copy of the identifier and data length information for the selected data segment (Block 304). As mentioned above, the receiving device 110 communicates status updates to the transmitting device 111 which are then stored in the transmitter's 111 global bloom filter 218. By the global bloom filter 218 having this information, the data reduction module 210 of the transmitter device 111 can make a decision as to whether only the identifier and data length information (as opposed to also including the actual content data) needs to be sent to the receiver device 110 for the selected data segment.

In response to the query in Block 304, if the transmitting device's 111 global bloom filter 218 indicates that the receiving device 110 has a stored copy of the identifier and data length information for the selected data segment, the process proceeds to Block 306A. In contrast, if the transmitting device's 111 global bloom filter 218 indicates that the receiving device 110 does not have a stored copy of the identifier and data length information for the selected data segment, the process proceeds to Block 306B.

Referring to Block 306A, the data reduction module 210 in the transmitter device 111 will determine a local index indicates that the identifier and data length is stored locally in the transmitter device 111. In response to the query in Block 306A, if the transmitter device's 111 index component 214 indicate that there is no match for the queried identifier and data length information, the process proceeds directly to Block 310A.

In contrast, if the transmitter device's 111 local index component 214 indicate that the there is a matching entry of the identifier and data length information for the data segment, the process proceeds to Block 308A. Accordingly, the transmitter's 111 data reduction module 210 will store the identifier and data length information in the transmitter device's 111 index component 214 and store the corresponding content data bytes for the data segment in its data store 220 (Block 308A). In an aspect, the transmitter's data reduction module 210 will also update its local bloom filter 216 to indicate that is now has a stored copy of the content data in the data store 220. The process then proceeds to Block 310A.

As shown in FIG. 3, the data reduction module 210, in an aspect, marks, reserves or otherwise locks the content data bytes and associated identifier and data length information for each data segment, stored in the transmitter device's 111 (Block 310A). As shown in later steps in FIG. 3, the identifier and data length information and content data for the sent data segment remains locked or reserved until the data reduction module 210 in the transmitter device 111 receives an acknowledge message from the receiver device 110. Also in Block 310A, the data reduction module 210 writes only the identifier and data length information data for the selected data segment into one or more data packets as compressed data packet(s) to be transmitted to the receiving device 110.

Figure 4:
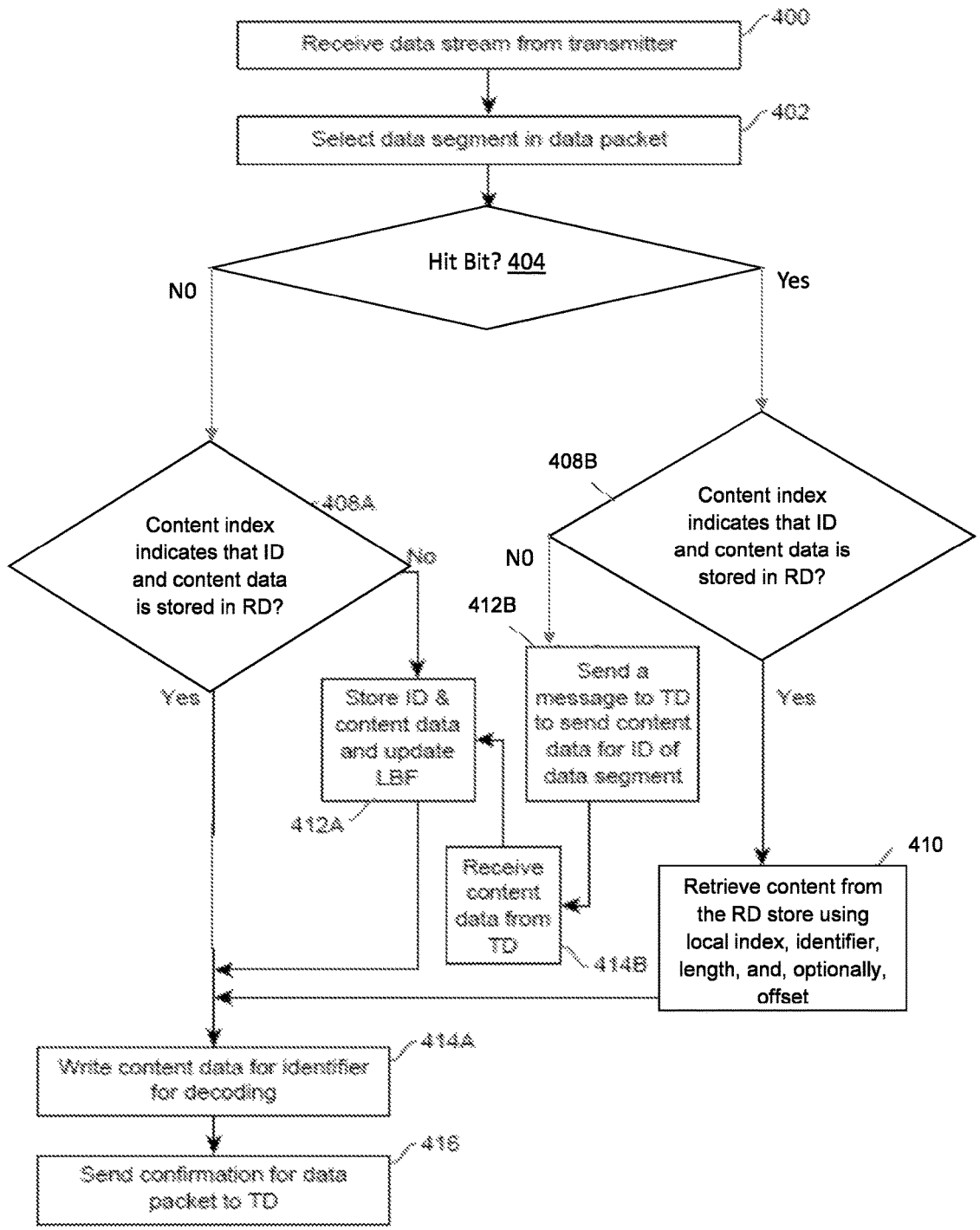
FIG. 4 illustrates a flow chart representing the process of receiving data packets in accordance with an aspect of the present disclosure.

In configuring the data segment to be encoded, the data reduction module 210 does not include the actual content data associated with the selected data segment, but only provides the identifier and data length information associated with the selected data segment. Since the transmitter's 111 index component 214 and/or global bloom filter 218 indicated in Block 304 that the receiver 110 has a copy of the identifier and data length information as well as content data for the selected data segment, the receiver's 110 data reduction module 210 will be able to utilize only the identifier and data length information to successfully locate and retrieve the associated content data from its own data store 220 and accordingly decode the data segment (FIG. 4).

In an aspect, since the data being sent from the transmitter 111 is compressed, the transmitter's 111 data reduction module 210 may add one or more additional bits to the data packet indicating a "hit" as well as writing the identifier, length, and, optionally, an offset to the data packet. In an aspect, the data reduction module 210 repeats this process by selecting and analyzing additional data segments until the transmitter device's 111 buffer is filled to capacity. The transmitter device 111 will then send a data stream having a plurality of data packets having encoded and/or unencoded data segments to the receiver device 110 over the network (Block 312A).

As mentioned above, the identifier and data length information and content data for the sent data segment remains locked or reserved in the transmitter device 111 until it receives an acknowledge message from the receiver device 110. Once the acknowledgement message is received from the receiver device 110 (Block 314), the transmitter's 111 data reduction module 210 will unlock or otherwise remove the reservation placed on the data segment's identifier and data length information and content data (Block 316), thereby allowing such information to be deleted or overwritten.

Referring back to Block 304, if the transmitting device's 111 global bloom filter 218 indicates that the receiving device 110 appears to have the identifier and data length information and a stored copy of the corresponding content data bytes for the selected data segment, the process proceeds to Block 306B.

In Block 306B, the transmitter device 111 will determine whether a local index indicates that the identifier and data length is stored locally in the transmitter device 111, as described and illustrated earlier with reference to Block 306A. If the transmitter's 111 index component 214 finds a match for the queried identifier and data length information for the data segment, the process proceeds to Block 310B, as discussed in more detail below. In contrast, if the transmitter's 111 index component 214 and/or local bloom filter 216 does not find a match for the queried identifier and data length information for the data segment, the data reduction module 210 stores the content data bytes corresponding to the data segment in the data store 220. The transmitter's 111 data reduction module 210 also adds the identifier and data length information in the local index component 214 and updates its local bloom filter 216 (Block 308B).

From Block 306B or 308B, the data reduction module 210 then writes the identifier and data length information and the content data bytes for the selected data segment (i.e. uncompressed data segment) into a data packet (Block 310B). In an aspect, since the data is an uncompressed data segment, the transmitter's 111 data reduction module 210 may add one or more additional bits to the data packet indicating a "miss". The uncompressed data segment is then sent to the receiver device 110 (Block 312B).

FIG. 4 illustrates a flow chart representing the process performed by a network traffic management device which receives a data stream from a transmitter device in accordance with an aspect of the present disclosure. As shown in FIG. 4, the receiving device 110 receives the data stream from the transmitting device 111 in which one or more data packets may be encoded and/or unencoded in a manner consistent with the novel process described above in FIG. 3 (Block 400).

As shown in FIG. 4, the data reduction module 210 of the receiving device 110 selects and extracts a data segment in a data packet in the data stream (Block 402). In an aspect, the data reduction module 210 may determine, upon processing a selected data segment, whether that the data segment contains a hit bit, as in Block 404. If the data reduction module 210 determines that the selected data segment does not contain a hit bit, then the No branch is taken to Block 408A. At Block 408A, the data reduction module 210 in the receiver device 110 determines whether a content index indicates that the identifier and content data is stored in the receiver device's 110 data store for the data segment. If the content index indicates that identifier and content data is stored in the receiver device's 110 data store 220, then the data reduction module 210 proceeds to block 414A, as described and illustrated in more detail below.

In contrast, if the content index indicates that identifier and content data is stored in the receiver device's 110 data store 220, the receiver's 110 data reduction module 210 enters the identifier and data length information in one or more index components 214 and also stores the corresponding content data bytes in the data store 220 (Block 412A). Additionally, the receiver's 110 data reduction module 210 updates its own local bloom filter 216 to indicate that a stored copy of the content data and a matching entry of the identifier and data length information is present in the receiver device 110 (Block 412A).

Referring back to Block 404, if the receiver's 110 data reduction module 210 determines that the selected data segment in the data packet includes a hit bit, then the Yes branch is taken to Block 408B. As shown in Block 408B, the data reduction module 210 in the receiver device 110 determines whether a content index indicates that the identifier and content data is stored in the receiver device's 110 data store for the data segment, as described and illustrated earlier with reference to Block 408A. If the content index indicates that identifier and content data is stored in the receiver device's 110 data store 220, then the data reduction module 210 locates the content data using the local index, identifier, data length, and optional offset and retrieves it from the receiver's 110 data store 220 (Block 410). The process then proceeds to Block 414A.

In contrast, if the content index indicates that identifier and content data is stored in the receiver device's 110 data store 220, the receiver's 110 data reduction module 210 sends a resend message back to the transmitting device 111 (Block 412B). In particular, the resend communication identifies the receiver device 110, the selected data segment, the identifier and data length information and other relevant information to allow the transmitting device 111 to locate the content data and send it to the receiver device 110.

The transmitter's 111 data reduction module 210, upon receiving and processing the resend communication, is able to retrieve the content data from its data store 220 using the identifier and data length information (Block 310B in FIG. 3). It is assumed that since the transmitter's 111 data reduction module 210 locks the content data such that it cannot be deleted until a confirmation message for that data segment is received from the receiver 110, that content data cannot be deleted or erased from the transmitter's 111 data store 220. Once the content data is retrieved, the transmitter's 111 data reduction module 210 writes the content data into a resend data packet to be sent to the requesting receiving device 110 (Block 312B in FIG. 3). The resend data packet is then sent to the receiving device 110 (Block 314 in FIG. 3). In an aspect, the receiver's 110 data reduction module 210 receives the resend data packet from the transmitter 111 (Block 414B). The process then proceeds to Block 412A.

In an aspect, the transmitter's 111 data reduction module 210, before resending the data packet, may write additional information which instructs the receiver's 110 data reduction module 210 to automatically store the content data as well as update its index component 214 with the identifier and data length information upon receiving it (as opposed to again querying its local bloom filter). This allows the receiver device 110 to quickly process, decode and write the data packet to its buffer.

Irrespective of whether the receiver device 110 initially has or does not have the content data for the identifier, the data reduction module 210 thereafter writes the content data for the identifier for decoding, as shown in Block 414A. In an aspect, after the content data for the data segment is written for decoding, the data reduction module 210 sends a confirmation message back to the transmitting device 111 for that data segment (Block 416). In particular, the confirmation message notifies the transmitting device 111 that the data segment has been successfully processed at the receiver 110, wherein the stored content data and identifier and data length information for the selected data segment can be unlocked and deletable in the transmitting device 111.

Figure 5:
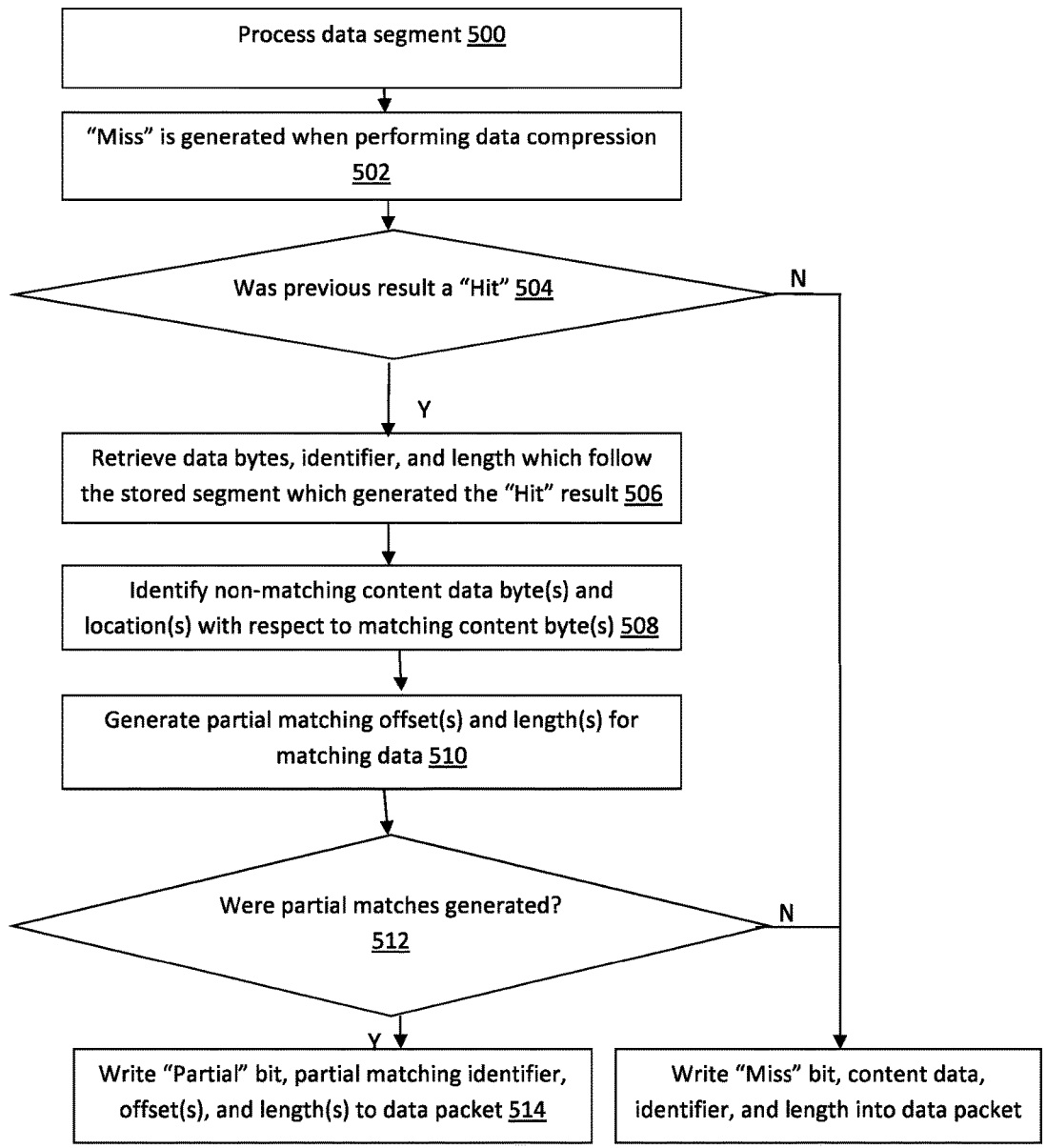
FIG. 5 illustrates a flow chart representing the process of handling variable length matches in accordance with an aspect of the present disclosure.

FIG. 5 illustrates a flow chart representing a process performed by the data reduction module of a transmitting device with regard to an encoded data segment having partially matched content data bytes stored in the transmitting device, in accordance with an aspect of the present disclosure. As shown in FIG. 5, the data reduction module 210 of the transmitting device 111 processes a data segment in a data stream to be compressed and transmitted to the receiving device 110 (Block 500). In the example process of FIG. 5, the data reduction module 210 of the transmitting device 111 examines the content data bytes of the data segment and at some point during the compression, identifies a miss indicating a portion of the data in the data segment that does not match stored data. In step 504, the data reduction module 210 of the transmitting device 111 determines whether the previous result, prior to generating the miss, was a hit indicating that the data in the previous data segment matched a stored data segment. If the data reduction module 210 determines that the previous result was a hit, then the Yes branch is taken to step 506.

In step 506, the data reduction module 210 of the transmitting device 111 retrieves data bytes, an identifier, and a length which follow the stored segment which generated the hit associated with the previous result. In step 508, the data reduction module 210 of the transmitting device 111 identifies non-matching content data byte(s) and location(s) with respect to matching content byte(s) in the data bytes retrieved from the data store 220 in step 506. With respect to the matching content byte(s), in step 510, the data reduction module 210 of the transmitting device 111 generates partial matching offset(s) and length(s).

In step 512, the data reduction module 210 of the transmitting device 111 determines whether any partial matches were generated as a result of steps 506-510. Optionally, the data reduction module 210 of the transmitting device 111 also determines whether the receiver device 110 has the content for the generated partial matching identifier by checking the global bloom filter prior to sending the data packet in step 514. If the data reduction module 210 determines that partial matches were generated (and the receiver device 110 has the content), then the Yes branch is taken to step 514. In step 514, the data reduction module 210 of the transmitting device 111 writes at least one bit indicating a partial match, a generated partial matching identifier, offset(s), and length(s) to a data packet.

Referring back to step 504 and 512, if the data reduction module 210 determines the previous result was not a hit or that no partial matches were generated (or the receiver device 110 does not have the content), then the No branch is taken from steps 504 and 512, respectively, to step 516. In step 516, the data reduction module 210 of the transmitting device 111 writes at least one bit indicating a miss, content data, an identifier, and a length into a data packet. The data packets generated in steps 514 and 516 are then sent to the receiver device 110. If the data reduction module 210 of the transmitting device 111 determines the receiver device 110 does not have the content for the generated partial matching identifier, then step 516 is performed.

Figure 6:
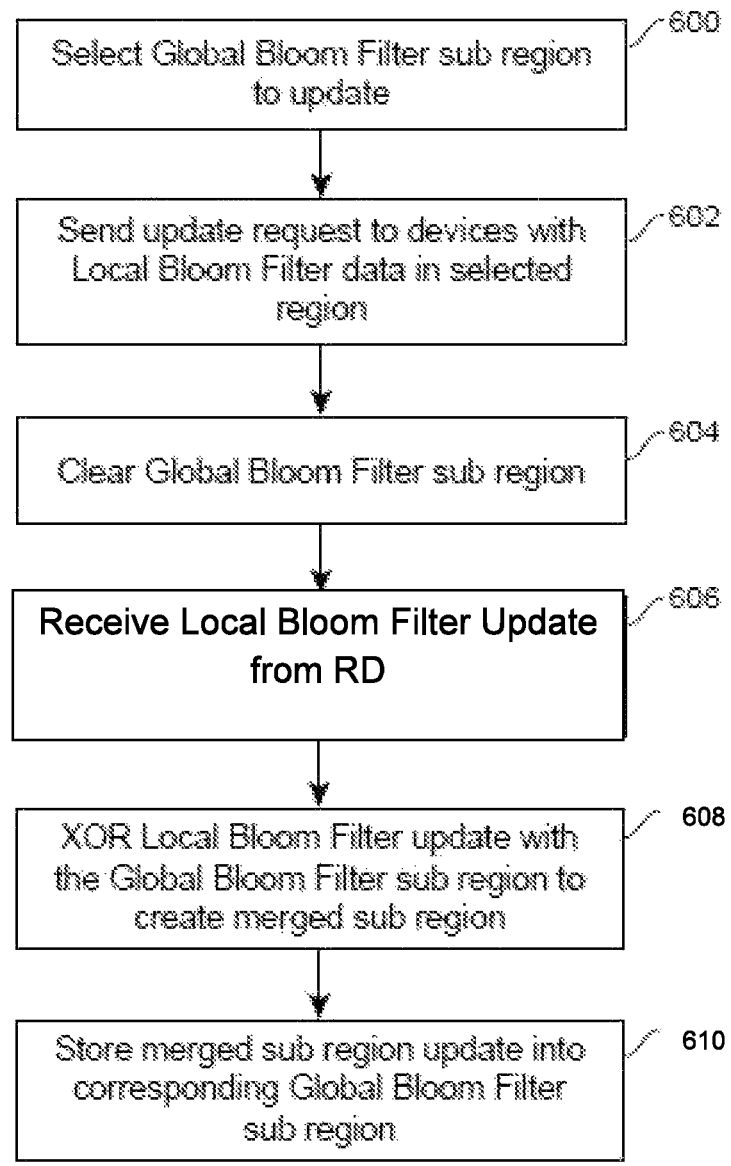
FIG. 6 illustrates flow charts representing the process of migrating local bloom filters of other network devices into a network device's global bloom filter in accordance with an aspect of the present disclosure.

FIG. 6 illustrates an exemplary process of updating a portion of a network traffic management device's global bloom filter in accordance with an aspect of the present disclosure. As shown in FIG. 6, a network traffic management device will update at least a portion of its global bloom filter 218 by selecting a sub-region of its global bloom filter 218 which contains update information of one or more local bloom filters 216 of at least one other network device(s). In an aspect, a particular sub-region of a network device's global bloom filter 218 may contain portions of two or more other network device's local bloom filters 216. For example, a sub-region in network device's 111 global bloom filter 218 may contain a portion of the network device's 110 local bloom filter and a portion of network device's 109 local bloom filter (FIG. 1) in accordance with an aspect of the present disclosure.

Regarding FIG. 6, the network device 111 may choose to update a sub-region in its global bloom filter 218 to update (Block 600). In an aspect, the network device 111 will update only those sub-regions of its global bloom filter 218 which have crossed a threshold value or percentage of true "1" or false "0" bits with respect to the corresponding other network devices 109, 110. The reason for this is that since bloom filters are normally only additive (and other network devices 111 only set bits when it learns that content exists at one or more other network devices 109, 110), regions of the global bloom filter tend to fill up with "1" values. Once a threshold has been crossed, say 50% one bits (or more or less), the network device 111 selects those other network devices 109, 110 to get updates from.

Accordingly, the data reduction module 210 of network device 111 monitors the number of "1" bits that are set as a percentage of the global bloom filter region corresponding to another network device 109, 110. This list of remote devices is determined by which devices can set bits (but might not have) in that region. This list may be further restricted to the top N devices in terms of who the transmitting device 111 sends compressed data packets to.

The data reduction module 210 will accordingly identify those other corresponding network devices 109, 110 with which the network device 111 has recently communicated compressed data packets with and will send an update request to those network devices 109, 110 (Block 602). In particular, network device's 111 data reduction module 210 will request an update from a specified set of the other network device's 109, 110 local bloom filters 216 that correspond to the matching portions of device's 111 global bloom filter sub-region.

As shown in FIG. 6, the data reduction module 210 of the network device 111 thereafter clears the global bloom filter sub-region from the requested network devices 109, 110 (Block 604). The data reduction module 210 then receives the requested local bloom filter update from the specified set of other RD(s), which in this example includes network devices 109 and 110 (Block 606). The data reduction module 210 of the transmitter device 111 thereafter performs an XOR on the local bloom filter update(s) received from the various receiving network devices 109, 110 with the current version of the global bloom filter portion to generate a merged, updated global bloom filter sub-region (Block 608). The merged updated global bloom filter sub-region is then stored in the corresponding sub-region of the requesting network device's 111 global bloom filter 218 (Block 610).

Having thus described the basic concepts, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the examples. Additionally, the recited order of processing elements or sequences, or the use of numbers, letters, or other designations therefore, is not intended to limit the claimed processes to any order except as may be specified in the claims.

What is claimed is:

1. A method for facilitating deduplication in mesh networks using dictionary compression of encoded data to improve bandwidth utilization and scalability, the method implemented by a network traffic management system comprising one or more transmitter devices (TDs), one or more receiver devices (RDs), one or more client devices, or one or more server devices and comprising:

selecting a first data segment in a received data stream having a universal first identifier and data length information and a corresponding first plurality of content data bytes;

querying a global probabilistic data structure to determine when an RD has a stored copy of the first plurality of content data bytes and the corresponding universal first identifier and data length information for the first data segment, and when the determining indicates that the RD has the stored copy of the universal first identifier and data length information and first plurality of content data bytes for the first data segment:

performing dictionary compression by preparing a first encoded data packet, wherein the first encoded data packet includes the universal first identifier and data length information without the first plurality of content data bytes for the data segment; and sending the first encoded data packet over a network to the RD to facilitate retrieval of the first plurality of content data bytes associated with the first data segment from the RD's data store and decoding of the first data segment to include the first plurality of content data bytes without requiring that the first plurality of content data bytes for the data segment be transmitted over the network.

2. The method of claim 1, further comprising:

querying a local probabilistic data structure to determine when a copy of the universal first identifier and data length information and first content data bytes for the first data segment is stored locally; and storing the universal first identifier and data length information in one or more index components, storing the first content data bytes in a data store, and updating the local probabilistic data structure to reflect that a copy of the universal first identifier and data length information and the first content data bytes for the first data segment is locally stored, when the determining indicates that a copy of the universal first identifier and data length information and first content data bytes is not locally stored.

3. The method of claim 1, further comprising:

marking the universal first identifier and data length information and the first plurality of content data bytes for the first data segment as locked, wherein the universal first identifier and data length information and the first plurality of content data bytes cannot be deleted when marked as locked;

receiving a confirmation communication from the RD for the first data segment;

updating the global probabilistic data structure to reflect that the RD has the universal first identifier and data length information and first plurality of content data bytes of the first data segment stored locally in the RD; and marking the universal first identifier and data length information and the first plurality of content data bytes for the first data segment as being unlocked, wherein the universal first identifier and data length information and the first plurality of content data bytes are able to be deleted when marked as unlocked.

4. The method of claim 1, further comprising:

receiving a resend request from the RD, wherein the resend request comprises an instruction to send the first plurality of content data bytes for the first data segment;

retrieving the first content data bytes from a data store utilizing the universal first identifier and data length information;

sending the universal first identifier and the first plurality of bytes to the RD, wherein the universal first identifier and the first plurality of bytes remain in a locked status.

5. The method of claim 1, further comprising:

selecting a second data segment in the data stream, the second data segment including a plurality of second content data bytes;

determining a partial match between the plurality of content data bytes of the second data segment and content data bytes of a stored segment following a stored version of the first content data bytes of the first data segment;

identifying one or more non-matching content data bytes between the second data segment and the first data segment; and generating a universal second identifier corresponding to a universal third identifier of the stored segment following the stored version of the first content data bytes of the first data segment.

6. The method of claim 1, wherein the global probabilistic data structure comprises a bloom filter.

7. A non-transitory computer readable medium having stored thereon instructions for facilitating deduplication in mesh networks using dictionary compression of encoded data to improve bandwidth utilization and scalability comprising executable code, which when executed by at least one processor, causes the at least one processor to:

select a first data segment in a received data stream having a universal first identifier and data length information and a corresponding first plurality of content data bytes;

query a global probabilistic data structure to determine when a receiver device (RD) has a stored copy of the first plurality of content data bytes and the corresponding universal first identifier and data length information for the first data segment, and when the determining indicates that the RD has the stored copy of the universal first identifier and data length information and first plurality of content data bytes for the first data segment:

perform dictionary compression by preparing a first encoded data packet, wherein the first encoded data packet includes the universal first identifier and data length information without the first plurality of content data bytes for the data segment; and send the first encoded data packet over a network to the RD to facilitate retrieval of the first plurality of content data bytes associated with the first data segment from the RD's data store and decoding of the first data segment to include the first plurality of content data bytes without requiring that the first plurality of content data bytes for the data segment be transmitted over the network.

8. The non-transitory computer readable medium of claim 7, wherein the executable code, when executed by the at least one processor, further causes the processor to:

query a local probabilistic data structure to determine when a copy of the universal first identifier and data length information and first content data bytes for the first data segment is stored locally; and store the universal first identifier and data length information in one or more index components, store the first content data bytes in a data store, and update the local probabilistic data structure to reflect that a copy of the universal first identifier and data length information and the first content data bytes for the first data segment is locally stored, when the determining indicates that a copy of the universal first identifier and data length information and first content data bytes is not locally stored.

9. The non-transitory computer readable medium of claim 7, wherein the executable code, when executed by the at least one processor, further causes the processor to:
mark the universal first identifier and data length information and the first plurality of content data bytes for the first data segment as locked, wherein the universal first identifier and data length information and the first plurality of content data bytes cannot be deleted when marked as locked;
receive a confirmation communication from the RD for the first data segment;
update the global probabilistic data structure to reflect that the RD has the universal first identifier and data length information and first plurality of content data bytes of the first data segment stored locally in the RD; and
mark the universal first identifier and data length information and the first plurality of content data bytes for the first data segment as being unlocked, wherein the universal first identifier and data length information and the first plurality of content data bytes are able to be deleted when marked as unlocked.

10. The non-transitory computer readable medium of claim 7, wherein the executable code, when executed by the at least one processor, further causes the processor to:
receive a resend request from the RD, wherein the resend request comprises an instruction to send the first plurality of content data bytes for the first data segment;
retrieve the first content data bytes from a data store utilizing the universal first identifier and data length information; and
send the universal first identifier and the first plurality of bytes to the RD, wherein the universal first identifier and the first plurality of bytes remain in a locked status.

11. The non-transitory computer readable medium of claim 7, wherein the executable code, when executed by the at least one processor, further causes the processor to:
select a second data segment in the data stream, the second data segment including a plurality of second content data bytes;
determine a partial match between the plurality of content data bytes of the second data segment and content data bytes of a stored segment following a stored version of the first content data bytes of the first data segment;
identify one or more non-matching content data bytes between the second data segment and the first data segment; and
generate a universal second identifier corresponding to a universal third identifier of the stored segment following the stored version of the first content data bytes of the first data segment.

12. The non-transitory computer readable medium of claim 7, wherein the global probabilistic data structure comprises a bloom filter.

13. A transmitter device (TD) comprising memory comprising programmed instructions stored thereon and one or more processors configured to be capable of executing the stored programmed instructions to:
select a first data segment in a received data stream having a universal first identifier and data length information and a corresponding first plurality of content data bytes;
query a global probabilistic data structure to determine when a receiver device (RD) has a stored copy of the first plurality of content data bytes and the corresponding universal first identifier and data length information for the first data segment, and when the determining indicates that the RD has the stored copy of the universal first identifier and data length information and first plurality of content data bytes for the first data segment:
perform dictionary compression by preparing a first encoded data packet, wherein the first encoded data packet includes the universal first identifier and data length information without the first plurality of content data bytes for the data segment; and
send the first encoded data packet over a network to the RD to facilitate retrieval of the first plurality of content data bytes associated with the first data segment from the RD's data store and decoding of the first data segment to include the first plurality of content data bytes without requiring that the first plurality of content data bytes for the data segment be transmitted over the network.

14. The transmitter device (TD) of claim 13, wherein the one or more processors are further configured to be capable of executing the programmed instructions stored in the memory to:
query a local probabilistic data structure to determine when a copy of the universal first identifier and data length information and first content data bytes for the first data segment is stored locally; and
store the universal first identifier and data length information in one or more index components, store the first content data bytes in a data store, and update the local probabilistic data structure to reflect that a copy of the universal first identifier and data length information and the first content data bytes for the first data segment is locally stored, when the determining indicates that a copy of the universal first identifier and data length information and first content data bytes is not locally stored.

15. The transmitter device (TD) of claim 13, wherein the one or more processors are further configured to be capable of executing the programmed instructions stored in the memory to:
mark the universal first identifier and data length information and the first plurality of content data bytes for the first data segment as locked, wherein the universal first identifier and data length information and the first plurality of content data bytes cannot be deleted when marked as locked;
receive a confirmation communication from the RD for the first data segment;
update the global probabilistic data structure to reflect that the RD has the universal first identifier and data length information and first plurality of content data bytes of the first data segment stored locally in the RD; and
mark the universal first identifier and data length information and the first plurality of content data bytes for the first data segment as being unlocked, wherein the universal first identifier and data length information and the first plurality of content data bytes are able to be deleted when marked as unlocked.

16. The transmitter device (TD) of claim 13, wherein the one or more processors are further configured to be capable of executing the programmed instructions stored in the memory to:
receive a resend request from the RD, wherein the resend request comprises an instruction to send the first plurality of content data bytes for the first data segment;

retrieve the first content data bytes from a data store utilizing the universal first identifier and data length information; and send the universal first identifier and the first plurality of bytes to the RD, wherein the universal first identifier and the first plurality of bytes remain in a locked status.

17. The transmitter device (TD) of claim 13, wherein the one or more processors are further configured to be capable of executing the programmed instructions stored in the memory to:

select a second data segment in the data stream, the second data segment including a plurality of second content data bytes;

determine a partial match between the plurality of content data bytes of the second data segment and content data bytes of a stored segment following a stored version of the first content data bytes of the first data segment;

identify one or more non-matching content data bytes between the second data segment and the first data segment; and generate a universal second identifier corresponding to a universal third identifier of the stored segment following the stored version of the first content data bytes of the first data segment.

18. The transmitter device (TD) of claim 13, wherein the global probabilistic data structure comprises a bloom filter.

19. A network traffic management system comprising one or more transmitter devices (TDs), one or more receiver devices (RDs), one or more client devices, or one or more server devices, the system comprising memory comprising programmed instructions stored thereon and one or more processors configured to be capable of executing the stored programmed instructions to:

select a first data segment in a received data stream having a universal first identifier and data length information and a corresponding first plurality of content data bytes;

query a global probabilistic data structure to determine when an RD has a stored copy of the first plurality of content data bytes and the corresponding universal first identifier and data length information for the first data segment, and when the determining indicates that the RD has the stored copy of the universal first identifier and data length information and first plurality of content data bytes for the first data segment:

perform dictionary compression by preparing a first encoded data packet, wherein the first encoded data packet includes the universal first identifier and data length information without the first plurality of content data bytes for the data segment; and send the first encoded data packet over a network to the RD to facilitate retrieval of the first plurality of content data bytes associated with the first data segment from the RD's data store and decoding of the first data segment to include the first plurality of content data bytes without requiring that the first plurality of content data bytes for the data segment be transmitted over the network.

20. The network traffic management system of claim 19, wherein the global probabilistic data structure comprises a bloom filter.

* * * * *